(12) United States Patent
Bui et al.

(10) Patent No.: US 8,476,725 B2
(45) Date of Patent: Jul. 2, 2013

(54) HIGH DENSITY PHOTODIODES

(75) Inventors: Peter Steven Bui, Westminster, CA (US); Narayan Dass Taneja, Long Beach, CA (US)

(73) Assignee: OSI Optoelectronics, Inc., Hawthorne, CA (US)

(*) Notice: Subject to any disclaimer, the term of this patent is extended or adjusted under 35 U.S.C. 154(b) by 94 days.

(21) Appl. No.: 13/110,765

(22) Filed: May 18, 2011

(65) Prior Publication Data
US 2011/0278690 A1 Nov. 17, 2011

Related U.S. Application Data

(63) Continuation of application No. 12/637,557, filed on Dec. 14, 2009, now Pat. No. 7,968,964, which is a continuation of application No. 11/532,191, filed on Sep. 15, 2006, now Pat. No. 7,655,999.

(51) Int. Cl.
*H01L 31/0216* (2006.01)

(52) U.S. Cl.
USPC ........... 257/432; 257/448; 257/437; 257/466; 257/E31.11; 438/48; 438/73; 438/689

(58) Field of Classification Search
USPC ............ 257/447, 448, 437, 432, 466, E31.11, 257/E33.119; 438/48, 73, 689
See application file for complete search history.

(56) References Cited

U.S. PATENT DOCUMENTS

| 4,200,472 A * | 4/1980 | Chappell et al. ............... 136/246 |
| 4,874,939 A | 10/1989 | Nishimoto et al. |
| 4,887,140 A | 12/1989 | Wang |
| 4,904,608 A | 2/1990 | Gentner et al. |
| 4,904,861 A | 2/1990 | Epstein et al. |
| 4,998,013 A | 3/1991 | Epstein et al. |
| 5,144,379 A | 9/1992 | Eshita et al. |
| 5,214,276 A | 5/1993 | Himoto et al. |
| 5,237,197 A | 8/1993 | Snoeys et al. |
| 5,252,142 A | 10/1993 | Matsuyama et al. |
| 5,276,955 A | 1/1994 | Noddin et al. |

(Continued)

FOREIGN PATENT DOCUMENTS

| EP | 0 347 157 | 12/1989 |
| EP | 0 723 301 A2 | 5/1997 |

(Continued)

OTHER PUBLICATIONS

Y. Atatsu, Y. Muramoto, K. Kato, M. Ikeda, M. Ueki, A. Kozen, T. Kurosaki, K. Kawano, and J. Yoshida, "Long-wavelength multimode waveguide photodiodes suitable for hybrid optical module integrated with planar lightwave circuit", Electron. Lett., Vol. 31, pp. 2098-2100, 1995.

(Continued)

*Primary Examiner* — Thinh T Nguyen
(74) *Attorney, Agent, or Firm* — Novel IP

(57) ABSTRACT

The present invention is a front-side contact, back-side illuminated (FSC-BSL) photodiode arrays and front-side illuminated, back-side contact (FSL-BSC) photodiode arrays having improved characteristics, including high production throughput, low-cost manufacturing via implementation of batch processing techniques; uniform, as well as high, photocurrent density owing to presence of a large continuous homogeneous, heavily doped layer; and back to front intrachip connections via the homogenous, heavily doped layers on the front and back sides of the substrate.

16 Claims, 27 Drawing Sheets

U.S. PATENT DOCUMENTS

| | | |
|---|---|---|
| 5,408,122 A | 4/1995 | Reele |
| 5,430,321 A | 7/1995 | Effelsberg |
| 5,446,751 A | 8/1995 | Wake |
| 5,501,990 A | 3/1996 | Holm et al. |
| 5,576,559 A | 11/1996 | Davis |
| 5,599,389 A | 2/1997 | Iwasaki |
| 5,656,508 A | 8/1997 | So et al. |
| 5,818,096 A | 10/1998 | Ishibashi et al. |
| 5,825,047 A | 10/1998 | Ajisawa et al. |
| 5,869,834 A | 2/1999 | Wipenmyr |
| 5,923,720 A | 7/1999 | Barton et al. |
| 5,928,438 A | 7/1999 | Salami et al. |
| 6,175,141 B1 | 1/2001 | Hofbauer et al. |
| 6,218,684 B1 | 4/2001 | Kuhara et al. |
| 6,326,649 B1 | 12/2001 | Chang et al. |
| 6,352,517 B1 | 3/2002 | Flock et al. |
| 6,426,991 B1 | 7/2002 | Mattson et al. |
| 6,438,296 B1 | 8/2002 | Kongable |
| 6,489,635 B1 | 12/2002 | Sugg |
| 6,504,158 B2 | 1/2003 | Possin |
| 6,510,195 B1 | 1/2003 | Chappo et al. |
| 6,546,171 B2 | 4/2003 | Fukutomi |
| 6,569,700 B2 | 5/2003 | Yang |
| 6,593,636 B1 | 7/2003 | Bui et al. |
| 6,670,258 B2 | 12/2003 | Carlson et al. |
| 6,734,416 B2 | 5/2004 | Carlson et al. |
| 6,772,729 B2 | 8/2004 | Brosseau et al. |
| 6,815,790 B2 | 11/2004 | Bui et al. |
| 6,826,080 B2 | 11/2004 | Park et al. |
| 7,057,254 B2 | 6/2006 | Bui et al. |
| 7,112,465 B2 | 9/2006 | Goushcha et al. |
| 7,242,069 B2 | 7/2007 | Bui et al. |
| 2001/0034105 A1 | 10/2001 | Carlson |
| 2002/0056845 A1 | 5/2002 | Iguchi et al. |
| 2004/0113185 A1* | 6/2004 | Shibayama et al. .......... 257/292 |
| 2004/0222358 A1* | 11/2004 | Bui et al. ................... 250/214.1 |
| 2006/0220078 A1 | 10/2006 | Bui et al. |
| 2006/0278898 A1 | 12/2006 | Shibayama |
| 2008/0128846 A1 | 6/2008 | Bui et al. |

FOREIGN PATENT DOCUMENTS

| | | |
|---|---|---|
| EP | 1 069 626 A2 | 1/2001 |
| EP | 1 205 983 A1 | 5/2002 |
| WO | WO/00/52766 | 9/2000 |

OTHER PUBLICATIONS

Fukano et al., "High-REsponsivity and Low-Operation-Voltage Edge-Illuminated Refracting-Facet Photodiodes with Large Alignment Tolerance for Single-Mode Fiber", Journal of Lightwave Technology, vol. 16, No. 5, May 1997.

* cited by examiner

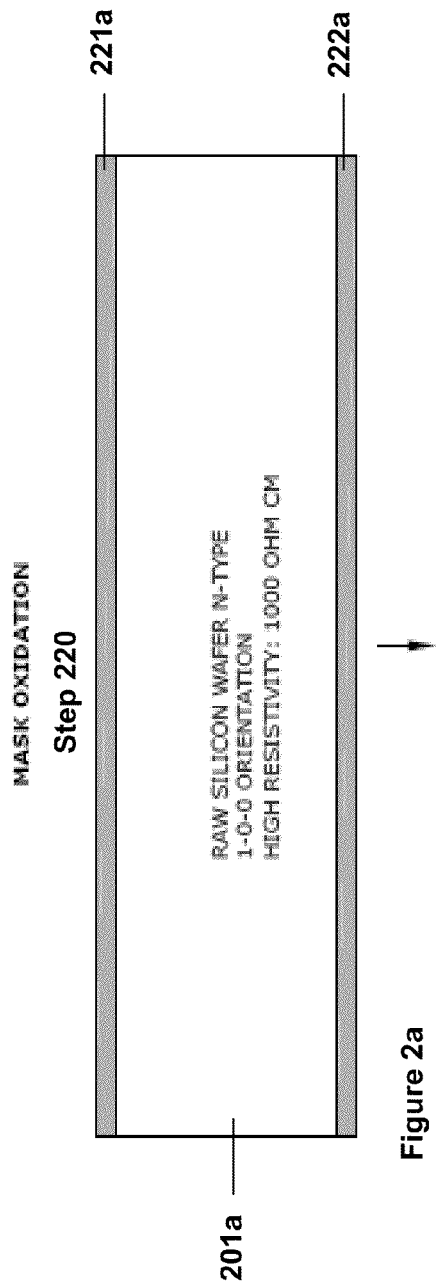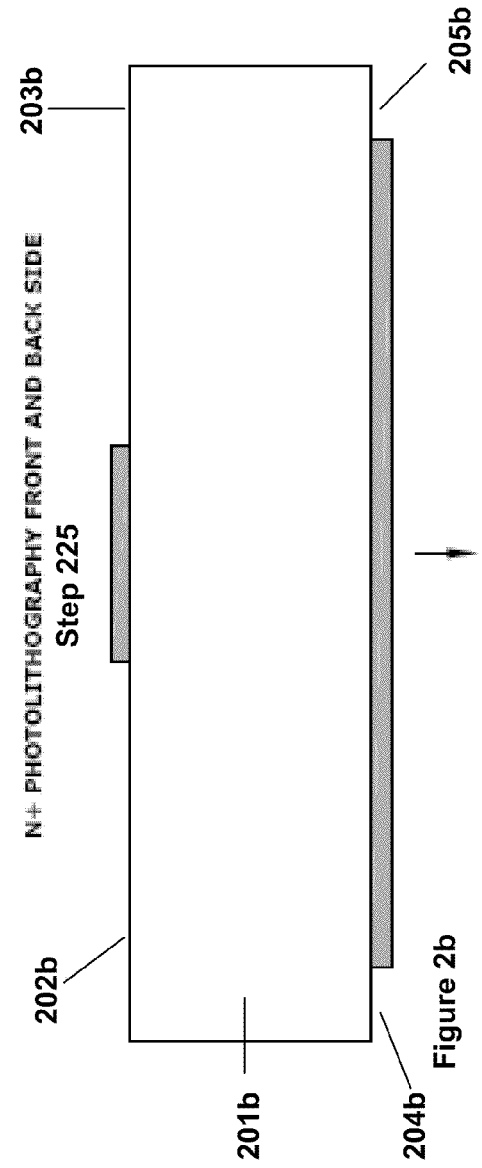

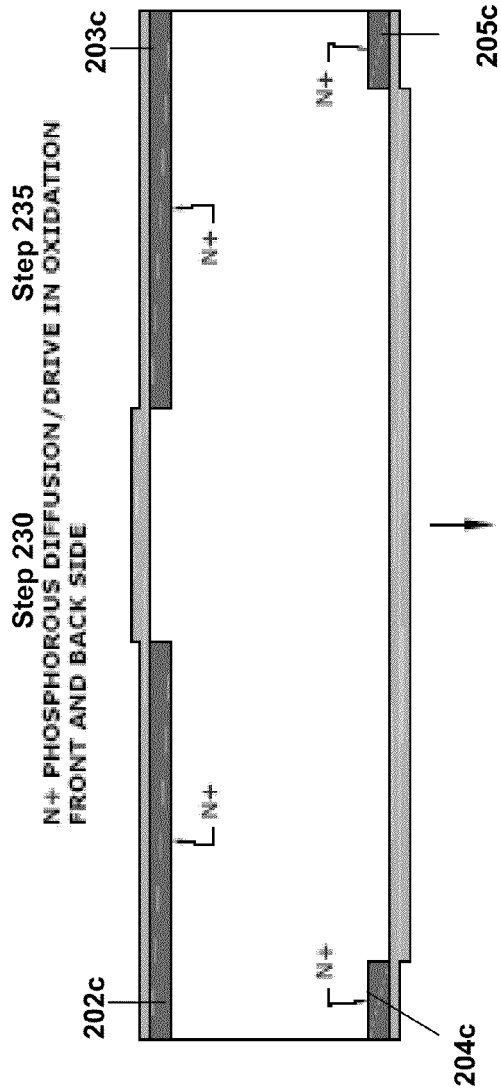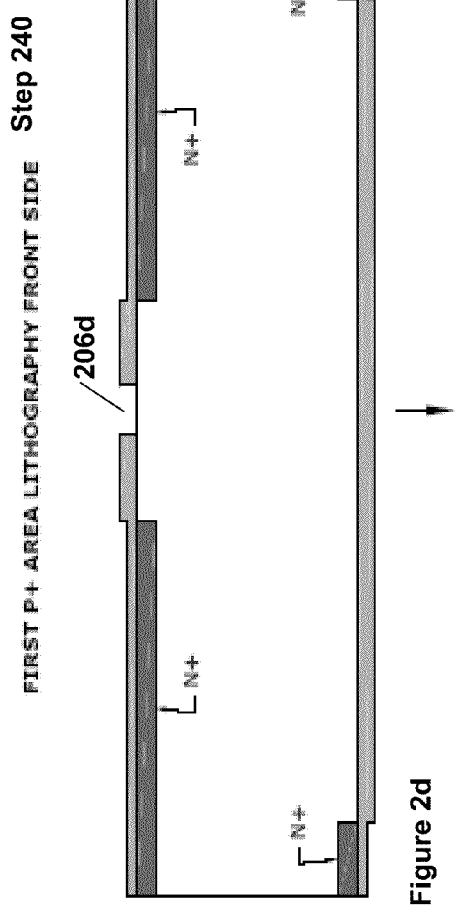

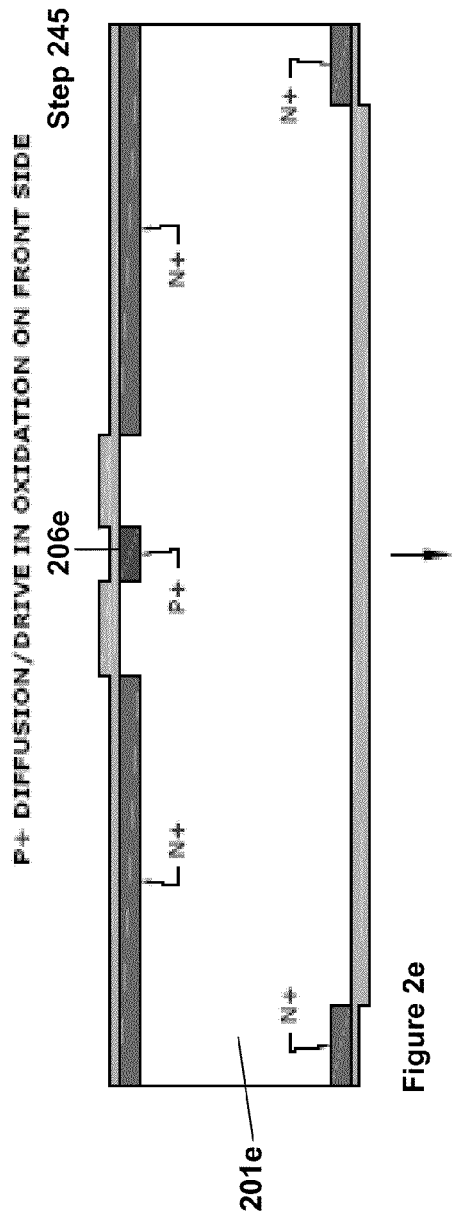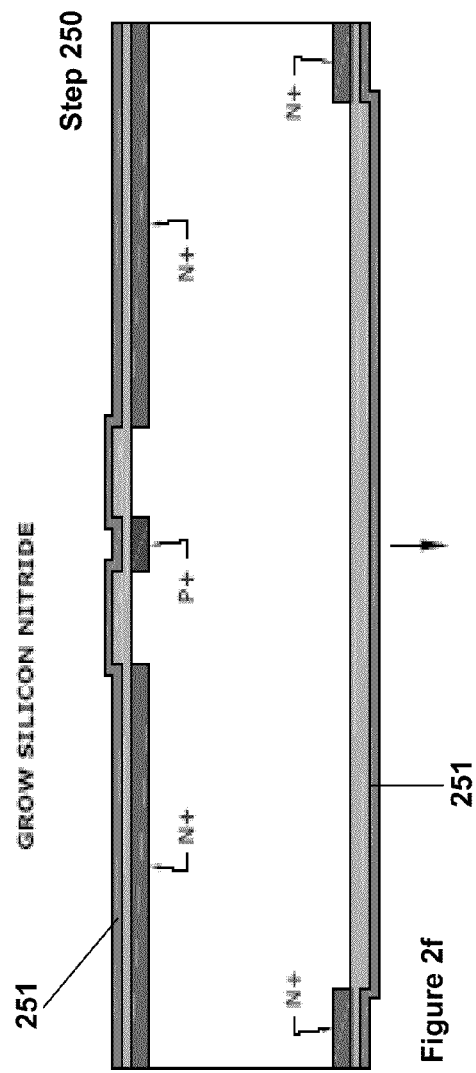

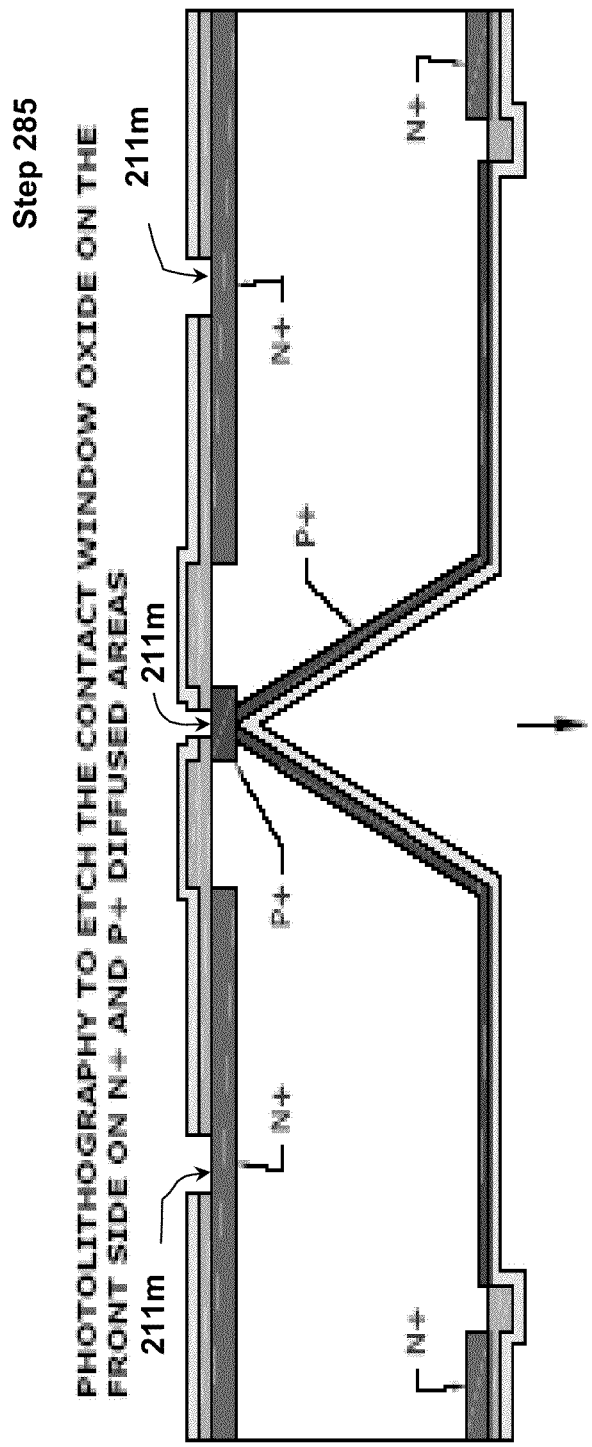

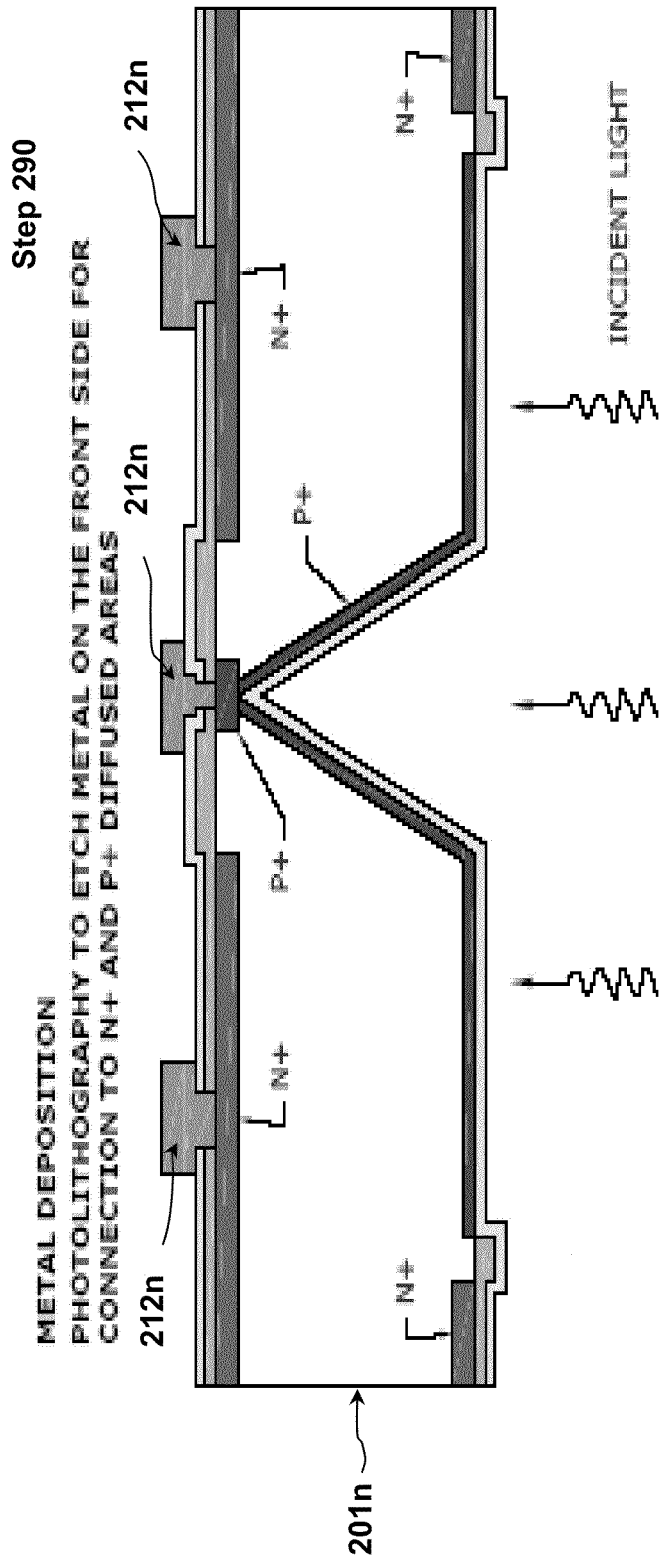

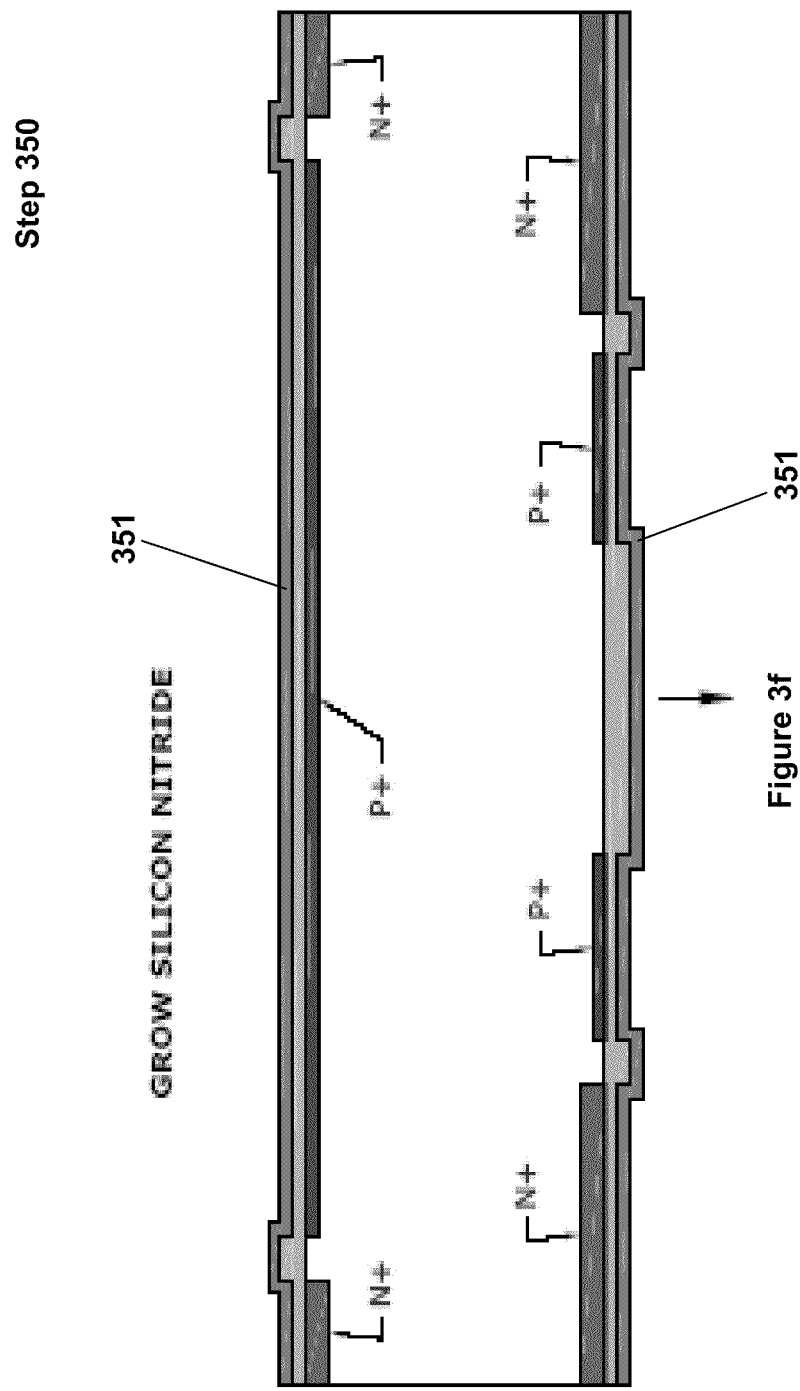

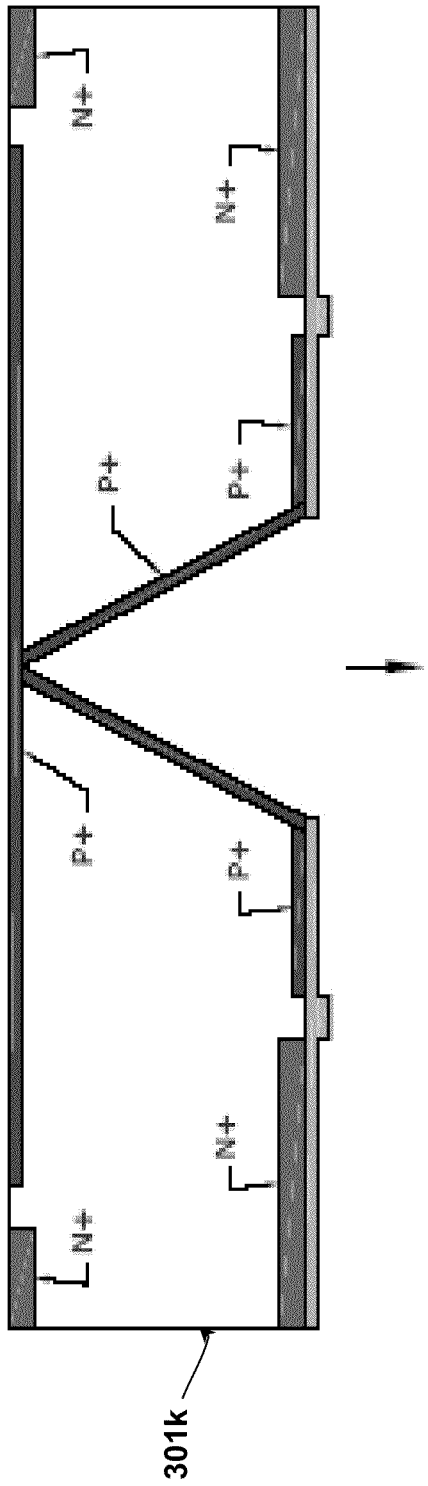

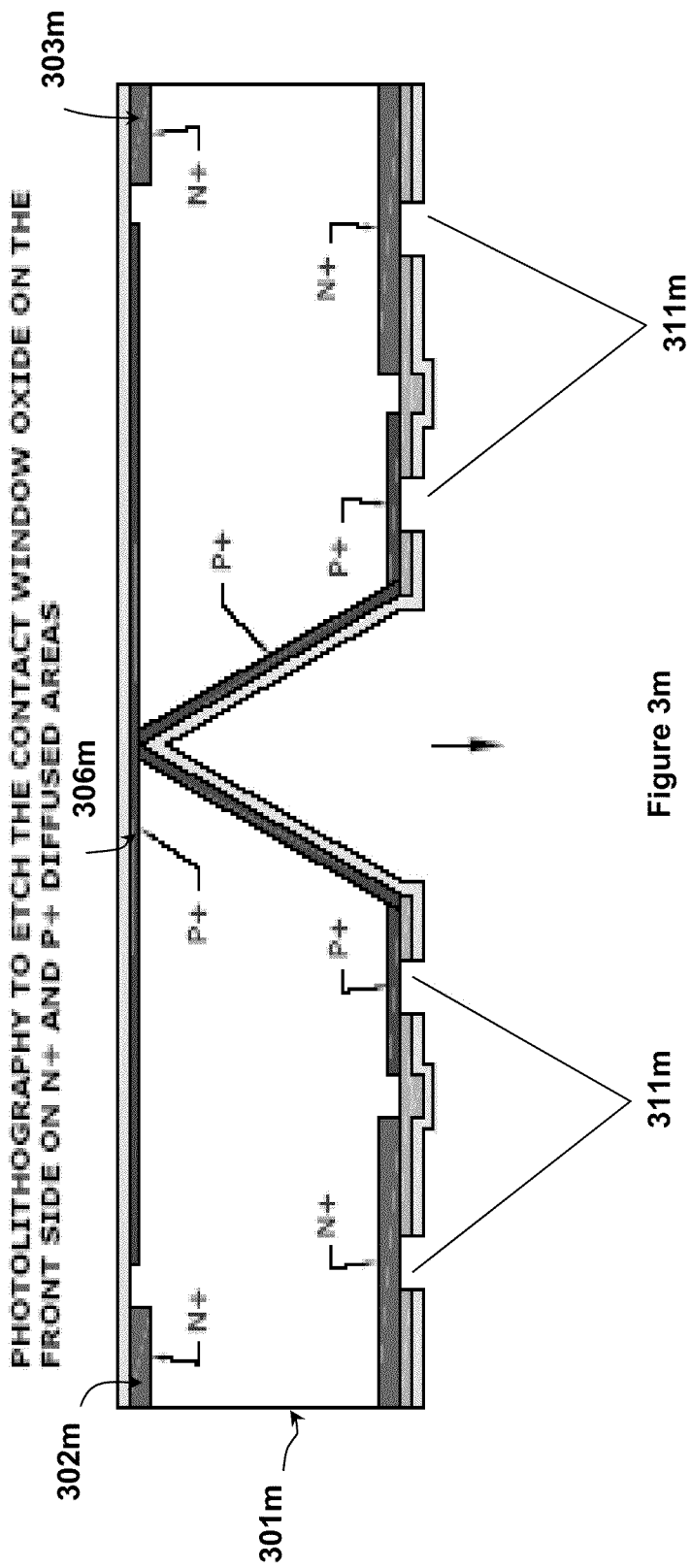

HIGH DENSITY PHOTODIODES

CROSS REFERENCE

The present application is a continuation of U.S. patent application Ser. No. 12/637,557, filed Dec. 14, 2009 and issued U.S. Pat. No. 7,968,964, which is a continuation of U.S. patent application Ser. No. 11/532,191, filed on Sep. 15, 2006, which has now issued as U.S. Pat. No. 7,655,999.

FIELD OF THE INVENTION

The present invention relates generally to the field of radiation detectors, and in particular, relates to front-side contact, back-side illuminated (FSC-BSL) photodiode arrays and front-side illuminated, back side contact (FSL-BSC) photodiode arrays having a plurality of heavily doped n+ and p+ diffused regions and further comprising three-dimensional (3D)-microstructures, such as grooves, pits, and cavities for forming electrical connections. Still more particularly, the present invention relates generally to photodiode arrays that can be manufactured with high-throughput and low cost and that are capable of generating a uniform, high-density photocurrent.

BACKGROUND OF THE INVENTION

Photodiode arrays or photodiodes are used in an assortment of applications including, but not limited to, radiation detection, optical position encoding, and low light-level imaging, such as night photography, nuclear medical imaging, photon medical imaging, multi-slice computer tomography (CT) imaging, and ballistic photon detection etc. Typically, photodiode arrays may be formed as one- or two-dimensional arrays of aligned photodiodes, or, for optical shaft encoders, a circular or semicircular arrangement of diodes.

Conventional computed tomography (CT) scanners and digital radiography systems use large numbers of X-ray detectors, on the order of several hundred to several thousand, in which each X-ray detector includes a scintillator to convert X-rays into light and a photocell to convert the light into an electrical signal. In such systems, it is preferred that the detectors are high density and that the detectors have equal pitch, i.e. the center-to-center distance from detector to detector is equal. Thus, the detectors are located as close as possible to one another, resulting in a detection system which has a high detection efficiency so that a patient is exposed to only the minimum amount of X-rays required to produce a satisfactory image. As the devices become smaller, however, it becomes more difficult to provide efficient interconnections between devices, thus negating the benefits of the smaller device size.

One conventional method of achieving high-density integration of photodiode arrays is to fabricate devices by implementing a plurality of techniques, including the creation of a pn-junction on one side of the substrate and subsequently routing the connection to the other side of the substrate via reactive ion etching (RIE). This results in the formation of dry etch holes, passivation of the walls of the dry etch holes with oxide, and development of a front-to-back connection, via placement of either a metal line or a doped polysilicon layer within the holes. This method, however, is not cost efficient and also results in low throughput of the device.

In addition, the prior art is replete with attempts to design, fabricate, and implement high-density semiconductor arrays. For example, U.S. Pat. No. 5,501,990, assigned to Motorola, Inc. discloses, "a method of fabricating a high density light emitting diode array with semiconductor interconnects comprising the steps of: providing a substrate of non-conductive material with a major surface, a conductive layer of material on the major surface of the substrate, a first carrier confinement layer on the conductive layer, an active layer on the first carrier confinement layer and a second carrier confinement layer on the active layer; separating portions of the second carrier confinement layer, the active layer and the first carrier confinement layer into a plurality of light emitting diodes positioned in rows and columns and separating the conductive layer into a plurality of columns connecting a first contact of each light emitting diode in a column to a first contact of each other light emitting diode in the column; forming column contacts connected to the conductive layer at an end of each column; and forming a second contact on the cap layer of each light emitting diode and connecting second contacts for each light emitting diode in a row to the second contacts of all other light emitting diodes in the row."

U.S. Pat. No. 5,656,508, also assigned to Motorola, Inc. discloses, "a method of fabricating a two-dimensional organic light emitting diode array for high density information image manifestation apparatus comprising: providing an electrically insulative substrate with a planar surface; depositing a layer of electrically conductive material on the planar surface of the substrate; patterning the layer of electrically conductive material to form a plurality of laterally spaced, conductive strips defining first electrodes; depositing a layer of dielectric medium on a surface of the conductive strips and the planar surface of the substrate; depositing a layer of photoresist on the layer of dielectric medium; patterning the photoresist using a cavity defining mask to expose portions of the dielectric medium; etching away the exposed portions of the dielectric medium to form a plurality of laterally spaced cavities, each of the plurality of cavities being positioned on an associated one of the defined first electrodes and exposing therein the associated first electrode; striping off the photoresist; depositing in each of the cavities an electroluminescent medium in the successive order of a layer of hole transporting material, a layer of active organic emitter, a layer of electron transporting material and a layer of a low work functional metal; depositing a layer of ambient stable metal on the dielectric medium so as to sealingly overlie each of the cavities and electrically contact the layer of low work function metal in the cavities; and patterning the layer of ambient stable metal into metal strips in a direction orthogonal to the conductive strips so as to define second electrodes sealing each of the plurality of cavities."

In addition high cost of manufacturing and low throughput, another typical problem with high-density integration of conventional photodiode arrays is the amount and extent of crosstalk that occurs between adjacent detector structures, primarily as a result of minority carrier current between diodes. The problem of crosstalk between diodes becomes even more acute as the size of the photodiode arrays, the size of individual detectors comprising the arrays, the spatial resolution, and the spacing of the photodiodes is reduced.

In certain applications, it is desirable to produce optical detectors having small lateral dimensions and spaced closely together. For example in certain medical applications, it would beneficial to increase the optical resolution of a detector array in order to permit for improved image scans, such as computer tomography scans. However, at conventional doping levels utilized for diode arrays of this type, the diffusion length of minority carriers generated by photon interaction in the semiconductor is in the range of at least many tens of microns, and such minority carriers have the potential to affect signals at diodes away from the region at which the minority carriers were generated. Therefore, the spatial resolution obtainable may be limited by diffusion of the carriers within the semiconductor itself, even if other components of the optical system are optimized and scattered light is reduced.

Various approaches have been used to minimize crosstalk including, but not limited to, providing inactive photodiodes to balance the leakage current and using conventional two-dimensional or three-dimensional structures, such as trenches, moats, or insulating structures between photodiodes or other active devices to provide isolation between the devices.

For example, U.S. Pat. No. 4,904,861, assigned to Agilent Technologies, Inc., discloses "an optical encoder comprising: a plurality of active photodiodes in an array on a semiconductor chip; a code member having alternating areas for alternately illuminating and not illuminating the active photodiodes in response to movement of the code member; means connected to the active photodiodes for measuring current from the active photodiodes; and sufficient inactive photodiode area on the semiconductor chip at each end of the array of active photodiodes to make the leakage current to each end active photodiode of the array substantially equal to the leakage current to an active photodiode remote from an end of the array". Similarly, U.S. Pat. No. 4,998,013, also assigned to Agilent Technologies, Inc. discloses "means for shielding a photodiode from leakage current comprising: at least one active photodiode on a semiconductor chip; means for measuring current from the active photodiode; a shielding area having a photodiode junction substantially surrounding the active photodiode; and means for biasing the shielding area photodiode junction with either zero bias or reverse bias."

In addition to manufacturing cost, low throughput, and crosstalk, it is difficult to achieve high density photodiode arrays with uniformity of generated photocurrent and sufficient density of generated photocurrent. The photocurrent may be enhanced by internal gain caused by interaction among ions and photons under the influence of applied fields, such as occurs in an avalanche photodiode (APD). Elsewhere, passivation of photodetectors via sulfidization has repeatedly shown reduction of surface states, thereby reducing dark current density in sequence incrementing photocurrent density.

As mentioned above, as photodiode detector devices become smaller, it becomes more difficult to provide efficient interconnections between devices, thus putting an additional demand on device electrical requirements. The prior art has attempted to manage interconnect density by forming dense metal interconnect patterns, because high-density VLSI and ULSI devices typically require multiple levels of surface metallization in order to accommodate their complex wiring patterns. Multiple level metallization creates planarity problems in the metallization layers, however, thereby limiting interconnection density. Complex process steps are also needed to provide multiple levels of metallization.

For example, U.S. Pat. No. 5,276,955, assigned to Supercomputer Systems Limited Partnership discloses "a method for forming a multilayer substrate having high density area array interconnects, the method comprising the steps of: (a) providing three or more pre-assembled subsections, each subsection comprising: a planar substrate having a pair of generally planar exposed surfaces and being comprised of a dielectric medium having a plurality of conductive layers disposed therein, the conductive layers including: at least one power layer; and at least one X-Y signal pair layer; and a pad layer on at least one of the surfaces of the planar substrate, the pad layer comprising a plurality of metallic interconnect pads disposed on the surface of the planar substrate such that an exposed surface of the interconnect pads is raised above the exposed surface of the dielectric medium surrounding the interconnect pads, each of the interconnect pads being selectively connected to one or more conductive regions in the signal pair layer or the power layer; (b) stacking the three or more pre-assembled subsections together such that the interconnect pads on the pad layer of one subsection align with the interconnect pads on the pad layer of an adjacent subsection; and (c) electrically and mechanically joining the three or more pre-assembled subsections in a simultaneous manner to concurrently form the multilayer substrate by metallurgically bonding the interconnect pads on adjacent subsections without bonding the surrounding dielectric medium."

Thus, conventional high-density photodiode array manufacturing techniques are costly and have low throughput. More specifically, low-cost manufacturing and test techniques are not compatible with high-density photodiode array designs. Thus, there is a need for a high density photodiode array that can be manufactured at high-throughput and low-cost and that is capable of producing uniform, high-density photocurrent. There is also a need for a high-density semiconductor circuit and an economically, technically, and operationally feasible fabrication method for a photodiode array capable of generating uniform as well as high-density photocurrent.

In addition, there is a need for a front-side illuminated, back-side contact (FSL-BSC) photodiode array having improved characteristics, including high production throughput, low-cost manufacturing via implementation of batch processing techniques; uniform as well as high photocurrent density owing to the presence of a large continuous homogeneous, heavily doped layer; and front to back intrachip connections.

There is also a need for a front-side contact, back-side illuminated (FSC-BSL) photodiode array having improved characteristics, including high production throughput, low-cost manufacturing via implementation of batch processing techniques; uniform as well as high photocurrent density owing to the presence of a large continuous homogeneous, heavily doped layer; and back to front intrachip connections.

SUMMARY OF THE INVENTION

The present invention is directed towards detector structures, detector arrays, and design and implementation of detector arrays for an assortment of applications including, but not limited to, computerized tomography (CT) and non-CT applications. Specifically, the present invention is directed towards high-density photodiode arrays manufactured at high-throughput and low-cost, capable of generating uniform as well as high density photocurrent.

In one embodiment, the present invention is a photodiode, or an array of photodiodes, each of which comprises a substrate with at least a first side and a second side; a first doped region of a first conductivity type located proximate to the second side; a second doped region of said first conductivity type located proximate to the second side; a void in the substrate, wherein the void separates the first doped region and the second doped region, wherein the void extends substantially from the second side to the first side, wherein the void has sides, and wherein the sides are inclined and meet at a point proximate to the first side; a third doped region of the first conductivity type proximate to at least one of sides; and at least one doped region of a second conductivity type proximate to the first side. The term proximate means physically layered or located at, or substantially close enough to be considered, from a functional standpoint, physically layered or located at a particular position, e.g. the back side or front side of the substrate.

Optionally, the photodiode further comprises at least one passivation layer on the first side or the second side of the substrate. The photodiode comprises at least one anti-reflective layer on the first side or the second side of the substrate and/or a plurality of contact electrodes in electrical communication with each of the doped regions. The photodiode comprises a fourth doped region of the first conductivity type proximate to one of the sides of the void. Optionally, the photodiode comprises a doped region of a second conductivity type proximate to the second side. The impurity of the first conductivity type is p-type. The impurity of the second conductivity type is n-type.

In another embodiment, the present invention is a photodiode, or an array of photodiodes, each of which comprises a substrate with at least a front side and a back side; a first doped region of a first conductivity type located proximate to the back side; a second doped region of the first conductivity type located proximate to the back side; a void in said substrate, wherein the void separates the first doped region and the second doped region and wherein the void extends substantially from the back side to said front side, wherein the void has sides; and a third doped region of the first conductivity type proximate to at least one of sides. The photodiode comprises at least one doped region of a second conductivity type proximate to said front side or back side. The photodiode comprises at least one passivation layer on the front side or the back side of the substrate. The photodiode comprises at least one anti-reflective layer on the front side or the back side of the substrate and/or a plurality of contact electrodes in electrical communication with each of the doped regions. The photodiode comprises a fourth doped region of the first conductivity type proximate to one of the sides of the void. Optionally, the void comprises two inclined walls and a base, forming a V, and is doped with an impurity of a first conductivity type for electrically connecting the front side of the substrate to the back side of the substrate. In one embodiment, the first conductivity type is p-type and the second conductivity type is n-type. In another embodiment, the first conductivity type is n-type and the second conductivity type is p-type.

In another embodiment, the photodiodes of the present invention are made by performing a mask oxidation on a front side and back side of a device wafer; implementing n+ photolithography on the front and back sides; performing n+ diffusion followed by drive-in oxidation on the front and back sides; implementing a first p+ area photolithography on the front side; performing p+ diffusion followed by drive-in oxidation on the front side; growing a passivation layer on the front and back sides; implementing V-groove lithography on the back side; etching the V-groove on the back side; removing the passivation layer from the front and back sides; implementing a second p+ area lithography on the back side; performing a p+ diffusion followed by drive-in oxidation on the back side; growing an anti-reflective (AR) layer on the front and back sides; implementing a contact window lithography on the front side; and performing metal deposition followed by etching the metal on the front side.

BRIEF DESCRIPTION OF THE DRAWINGS

These and other features and advantages of the present invention will be appreciated, as they become better understood by reference to the following detailed description when considered in connection with the accompanying drawings, wherein.

DESCRIPTION OF THE INVENTION

Figure 1:
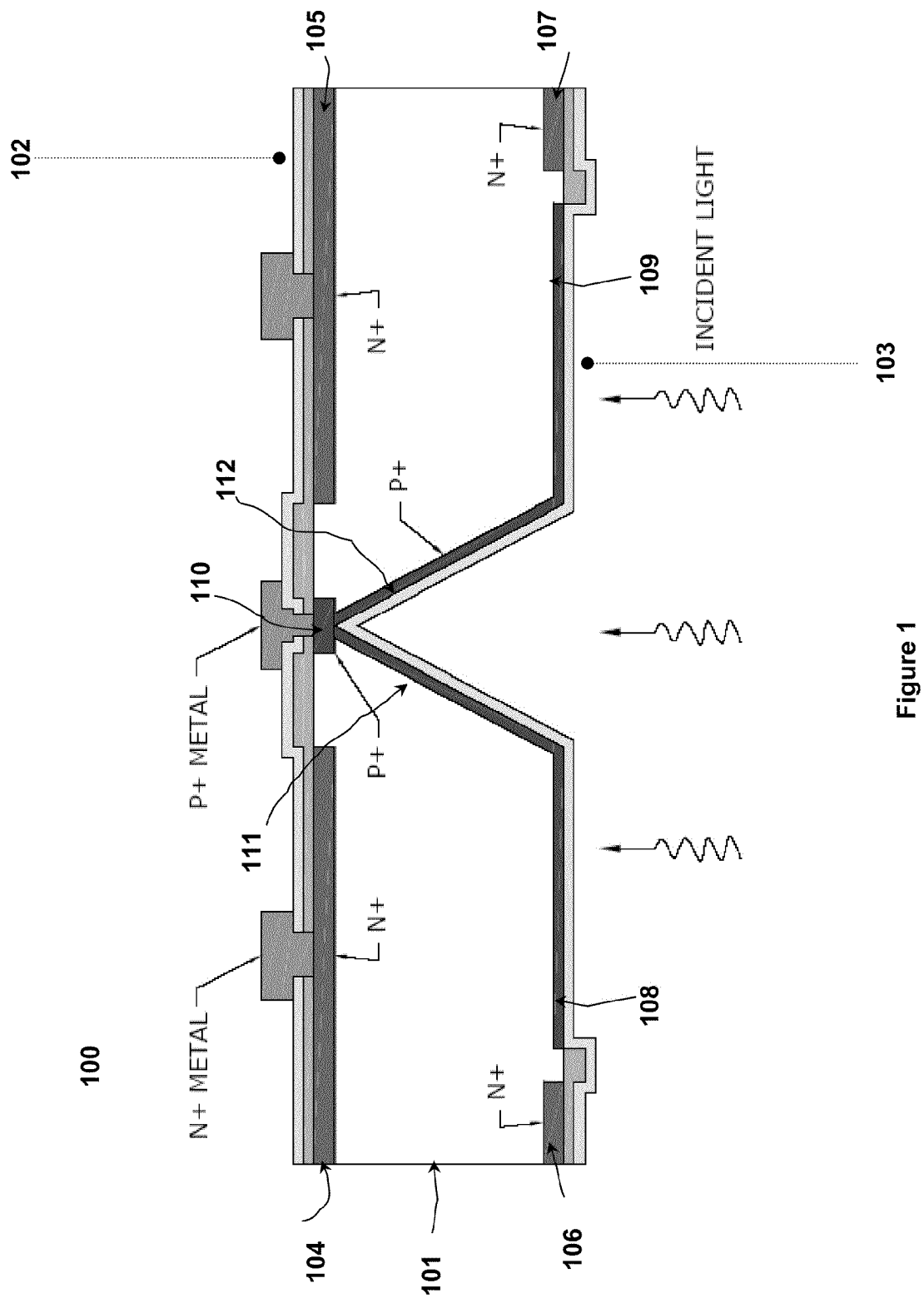
FIG. 1 is a detailed cross-sectional illustration of one embodiment of a high density, front-side contact, back-side illuminated, (FSC-BSL) photodiode array of the present invention.

The present invention is directed towards detector structures, detector arrays, and design and implementation of detector arrays for an assortment of applications including, but not limited to, computerized tomography (CT) and non-CT applications. Specifically, the present invention is directed towards high-density photodiode arrays manufactured at high-throughput and low-cost, capable of generating uniform as well as high density photocurrent.

More specifically, the present invention is directed towards a front-side contact, back-side illuminated (FSC-BSL) photodiode array having improved characteristics, including high production throughput, low-cost manufacturing via implementation of batch processing techniques; uniform as well as high photocurrent density owing to presence of a large continuous homogeneous, heavily doped layer; and back to front intrachip connections via the homogenous, heavily doped layers on the front and back sides of the substrate.

In one embodiment, the photodiode array of the present invention is designed and fabricated at low-cost with high production throughput and high-density of integration capable of generating high-photocurrent density. The photodiode array comprises at least a plurality of heterogeneous, heavily doped regions that 1) form front to back or back to front electrical connections and 2) facilitate generation of high-density photocurrent. More particularly, the photodiode array of the present invention is capable of generating high-density photocurrent due to a large area provided by the p+ diffusion regions.

Still more specifically, the photodiode array of the present invention comprises at least one heavily doped region, including, but not limited to, n+ shallow diffused and p+ shallow diffused. In one embodiment, the n+ and p+ shallow diffused regions facilitate formation of a front to back connection via linking the p+ shallow regions on both the front-side and the back-side of the wafer. In another embodiment, the n+ and p+ shallow diffused regions facilitate formation of a back to front connection via linking the p+ shallow regions on both the front-side and the back-side of the wafer.

In one embodiment, the p+ shallow region has a larger area when compared with a conventional planar p+ diffused region and therefore is suitable for applications where a high photocurrent density or high photocurrent/unit area is desired from the photodiode.

In one embodiment, the photodiode array of the present invention is manufactured using a diffusion process, wherein n+ shallow diffused and p+ shallow diffused regions are formed concurrently on the front and back sides of the substrate wafer, resulting in identical diffusion depths in half the time. Thus, the cost of manufacturing is significantly reduced via batch processing.

Reference will now be made to specific embodiments. Various modifications to the preferred embodiment will be readily apparent to those of ordinary skill in the art, and the disclosure set forth herein may be applicable to other embodiments and applications without departing from the spirit and scope of the present invention and the claims hereto appended. Thus, the present invention is not intended to be limited to the embodiments described, but is to be accorded the broadest scope consistent with the disclosure set forth herein.

FIG. 1 is a detailed illustration of one embodiment of high density, front side contact, back side illuminated, (FSC-BSL) photodiode 100 of the present invention. Single-crystal semiconductor substrate or device wafer 101 comprises at least one photodiode. Device wafer 101 may be made up of various materials, such as, but not limited to, Si or Ge. In one embodiment, the crystal orientation of device wafer 101 is preferably <1-0-0>. The resistivity of wafer 101 is preferably 1000 Ohm-cm ($\Omega$cm). Both the front and backside of wafer 101 are selectively etched, at appropriate positions via suitable etching techniques to form shallow diffused regions wherein the shallow diffused regions 1) form front to back connections and 2) facilitate generation of high-density photocurrent.

The FSC-BSL photodiode array may be fabricated using a plurality of etching and diffusion processes. In one embodiment, the photodiode array of the present invention is fabricated using an appropriate low thermal budget diffusion process, comprising at least one diffusion and/or drive-in step. In a second embodiment, the diffusion and/or drive-in is performed on both the front-side and back-side simultaneously to achieve identical diffusion depths with greater efficiency. In a third embodiment, the diffusion is performed in half the traditional time and thus results in reduced manufacturing cost. At least one, but preferably a plurality of heterogeneous, heavily doped regions, such as n+ and p+ type doped regions, are obtained as a result of this low cost, low thermal budget diffusion process. In a yet another embodiment, the photodiode array of the present invention is fabricated using an appropriate V-groove etching technique and subsequent doping, such as diffusion or ion implant, of the walls of the groove to connect the p+ diffused region from one side to the other side of the wafer thereby facilitating development of a front to back connection. Owing to the fact that V-groove etching can be done with a liquid such as KOH, this step can be done in a batch process resulting in much higher production throughput and lower cost. The FSC-BSL photodiode array of the present invention has a larger p+ diffused region when compared with a conventional planar p+ diffused region and therefore is suitable for applications where a high photocurrent density or high photocurrent/unit area is desired from the photodiode.

In one embodiment, at least a portion of substrate wafer 101 comprises a front side 102 and a back side 103, wherein the substrate wafer possesses appropriate specifications in agreement with the principles of the present invention. It should be understood by those of ordinary skill in the art that the above specifications are not limited to those recommended herein and that these specifications can be easily changed to suit varying design, fabrication, and functional requirements suggested herein.

In one embodiment, the substrate wafer 101 comprises a first plurality of heavily doped regions. Preferably, first heavily doped regions, such as left region 104 and right region 105 on front side 102 and left 106 and right 107 regions on back side 103 are doped with similar impurities of analogous conductivity types, such as either p-type or n-type. In one embodiment, the substrate wafer 101 comprises a second plurality of heavily doped regions left region 108, right region 109, center region 110, inclined regions 111, and 112, doped with similar impurities of analogous conductivity types, such as either p-type or n-type.

In one embodiment, if the first plurality of heavily doped regions 104, 105, 106, and 107 are doped with a suitable impurity of a first conductivity type wherein the first conductivity type is n-type, then a second plurality of heavily doped regions 108, 109, 110, 111, and 112 are doped with a suitable impurity of a second conductivity, wherein the second conductivity type is p-type. Boron and phosphorus (P) are the preferred p- and n-type dopants employed to create the p+ and n+ regions. It should be understood to those of ordinary skill in the art that any suitable doping material may be used.

In one embodiment, regions 108, 109, and 110 may possess the following position and orientation specifications: regions 108, 109, and 110 are parallel to both front side 102 and back side 103 of wafer 101. Regions 108 and 109 are proximate to back side 103 whereas region 110 is proximate to front side 102. In addition, regions 111 and 112 possess the following position and orientation specifications in one embodiment: orientation inclined with respect to both front side 102 and back side 103 of wafer 101. Optionally, 110, 111, and 112 respectively, comprise the base and walls, respectively, of a V-groove etched onto backside 102 of wafer 101, discussed in greater detail below.

In one embodiment, the FSC-BSL photodiode array of the present invention is designed and fabricated at low-cost with high production throughput and high-density of integration capable of generating high-photocurrent density. The photodiode array comprises at least a plurality of heterogeneous, heavily doped regions that 1) form front to back connections and 2) facilitate generation of high-density photocurrent. More particularly, the photodiode array of the present invention is capable of generating high-density photocurrent due to a large area provided by the p+ diffusion regions. It should be noted that although one exemplary manufacturing process is described herein, various modifications may be made without departing from the spirit and scope of the invention.

FIGS. 2a-2n illustrate one embodiment of the manufacturing steps of the high density, front side contact, back side illuminated, (FSC-BSL) photodiode array of the present invention. The manufacturing steps described herein provide one manufacturing example of the photodiode array of the present invention. Modifications or alterations to the manufacturing steps, their corresponding details, and any order presented may be readily apparent to those of ordinary skill in the art. Thus, the present invention contemplates many possibilities for manufacturing the photodiode array of the present invention and is not limited to the examples provided herein.

Referring now to FIG. 2a, the starting material of the photodiode array of the present invention is device or substrate wafer 201a. Device wafer 201a is preferably Si, of n-type conductivity, a crystal orientation of <1-0-0> and a resistivity as high as 1000 Ohm cm ($\Omega$cm). In addition, device wafer 201a is polished on both sides to allow for greater conformity to parameters, surface flatness, and thickness specifications. It should be understood by those of ordinary skill in the art, however, that the above specifications are not binding and that the type of material and wafer size, resistivity, and conductivity can be easily changed to suit the design, fabrication, and functional requirements of the present invention.

In step 220, device wafer 201a is subjected to standard mask oxidation process that grows a mask oxide layer 221a and 222a on the front-side and on the back-side of the device wafer, respectively. In one embodiment, the oxidation mask is made of $SiO_2$ or $Si_3N_4$ and thermal oxidation is employed to achieve mask oxidation. Standard mask oxidation is well known to those of ordinary skill in the art and will not be described in further detail herein.

As shown in FIG. 2b, after the standard mask oxidation is complete in step 220, the device wafer is subjected to n+ photolithography on both the front-side and back-side of device wafer 201b in step 225. Photolithography includes employing a photoresist layer to etch a specific pattern on the surface of the wafer. Generally, the photoresist layer is a photosensitive polymeric material for photolithography and photoengraving that can form a patterned coating on a surface. After selecting a suitable material and creating a suitable photoresist pattern, a thin photoresist layer is applied to both the front side and back side of device wafer 201b. In one embodiment, photoresist layer is applied via a spin coating technique. Spin coating is well-known to those of ordinary skill in the art and will not be described in detail herein. The photoresist layer is then appropriately treated to reveal n+ diffusion regions.

In an optional step, the device wafer is subjected to n+ masking. N+ masking is employed to protect portions of device wafer 201b. Generally, photographic masks are high precision plates containing microscopic images of preferred pattern or electronic circuits. They are typically fabricated from flat pieces of quartz or glass with a layer of chrome on one side. The mask geometry is etched in the chrome layer. In one embodiment, the n+ mask comprises a plurality of diffusion windows with appropriate geometrical and dimensional specifications. The photoresist coated device wafer 201b is aligned with the n+ mask. An intense light, such as UV light, is projected through the mask, exposing the photoresist layer in the pattern of the n+ mask. The n+ mask allows selective irradiation of the photoresist on the device wafer. Regions that are exposed to radiation are hardened while those that are reserved for diffusion remain shielded by the n+ mask and easily removed. The exposed and remaining photoresist is then subjected to a suitable chemical or plasma etching process to reveal the pattern transfer from the mask to the photoresist layer. An etching process is then employed to remove the silicon dioxide layer. In one embodiment, the pattern of the photoresist layer and/or n+ mask defines at least one region 202b devoid of the oxide layer deposited in step 220 and ready for n+ diffusion. In one embodiment, the pattern of the photoresist layer and/or n+ mask defines four regions 202, 203, 204, and 205, which are devoid of the oxide layer and ready for n+ diffusion.

Now referring to FIG. 2c, in step 230, device wafer 201c is subjected to n+ diffusion followed by drive-in oxidation after the n+ masking and etching step. Generally, diffusion facilitates propagation of a diffusing material through a host material. In a semiconductor wafer fabrication process, diffusion is employed to convert exposed portions of an n-type silicon wafer into a p-type silicon, or vice versa. In step 230, an appropriate amount of dopant atoms is deposited onto the substrate wafer and fills the gaps left by the removed photoresist layer. Then, the wafer is subjected to a drive-in oxidation process that is used to redistribute the dopant atoms and deposit them deeper into the wafer. In addition, exposed silicon surfaces are oxidized.

In one embodiment, the simultaneous front and backside diffusion involves using a suitable dopant of n-type conductivity. In one embodiment, simultaneous front-side and back-side diffusion on device wafer 201c may be achieved by using a liquid dopant source and rapid thermal processing (RTP). U.S. Pat. No. 5,928,438 is assigned to Salami, Jalal et al and teaches rapid thermal processing and is herein incorporated by reference. In one embodiment, phosphorus is used as dopant. Many approaches to the diffusion process are well-known to those of ordinary skill in the art and will not be discussed in detail herein. It should be noted, however, that the choice of diffusion method is dependent on many factors, including but not limited to the diffusion coefficient of the dopant, permissible error in the diffusion depth, and the diffusion source.

The resultant n+ diffusion regions are then subjected to, in step 235, high temperature drive-in oxidation, thus driving the dopant deeper into wafer 201c. Nuisance effects, which transpire when superfluous drive-in steps occur as an artifact of the overall process, tend to be a key problem in drive-in diffusion. More specifically, nuisance effects are compounded during each subsequent high temperature drive-in step, which causes further diffusion of the dopant into the substrate. Accounting of subsequent alterations during each high temperature drive-in step involved in the overall process is known as thermal budgeting. Thus, the thermal budget of an overall process is dependent on the number of steps.

In one embodiment, the low thermal budget diffusion process used to manufacture the FSC-BSL photodiode of the present invention comprises two steps: a first deposition/diffusion step, and a second drive-in oxidation step. The two-step example provided above is by way of example only and no way limiting to the present invention. It should be understood by those of ordinary skill in the art that any number of steps may be performed, keeping in mind overall cost efficiency and thermal budget of the device.

Referring now to FIG. 2d, in step 240, the front side of the device wafer 201d undergoes a first p+ area photolithography process, creating region 206d. As with any conventional photolithographic process, p+ photolithography comprises at least the following tasks, but is not limited to such tasks: substrate preparation; photoresist application; soft baking; mask alignment; exposure; development; hard baking; and etching. In addition, various other chemical treatments may be performed. In one embodiment, the pattern of the photoresist layer and/or p+ mask defines one region 206d, which is devoid of the oxide layer and ready for p+ diffusion.

As shown in FIG. 2e, region 206e is subject to p+ masking and diffusion in step 245. The p+ masking and diffusion process is similar to that delineated with respect to the n+ masking process described above and will not be repeated in detail herein. The p+ masking process of step 245 further comprises deposition and drive-in oxidation, allowing for predefined and/or predetermined thermal budget in accord with the principles of the present invention. In one embodiment, the p+ dopant is boron.

In step 250, shown in FIG. 2f, an insulation layer 251 of a suitable material is deposited on the front-side and the back-side of the device via suitable oxidation or nitridation techniques. By way of example, and by no means limiting, the insulation layer grown herein may utilize thin film materials, such as oxides, sulfides, fluorides, nitrides, selenides, and metals, among others. In one embodiment of the present invention, the insulation layer comprises silicon nitride $Si_3N_4$. In one embodiment, the $Si_3N_4$ layer is uniformly grown over both the front-side and the back-side of the wafer via employment of suitable chemical vapor deposition techniques. In one embodiment, the $Si_3N_4$ layer is grown such that it is transparent to UV light that facilitates UV treatment of the wafer during future photolithographic processes, if any. Generally, $Si_3N_4$ commonly used in silicon integrated circuit manufacturing is a dielectric material serving several purposes, such as a passivation layer or as a mask (barrier or insulation) against oxidation of the AR layer. Preferably, the $Si_3N_4$ has energy gap ~5 eV and density ~3.0 $g/cm^3$.

Figure 2G:
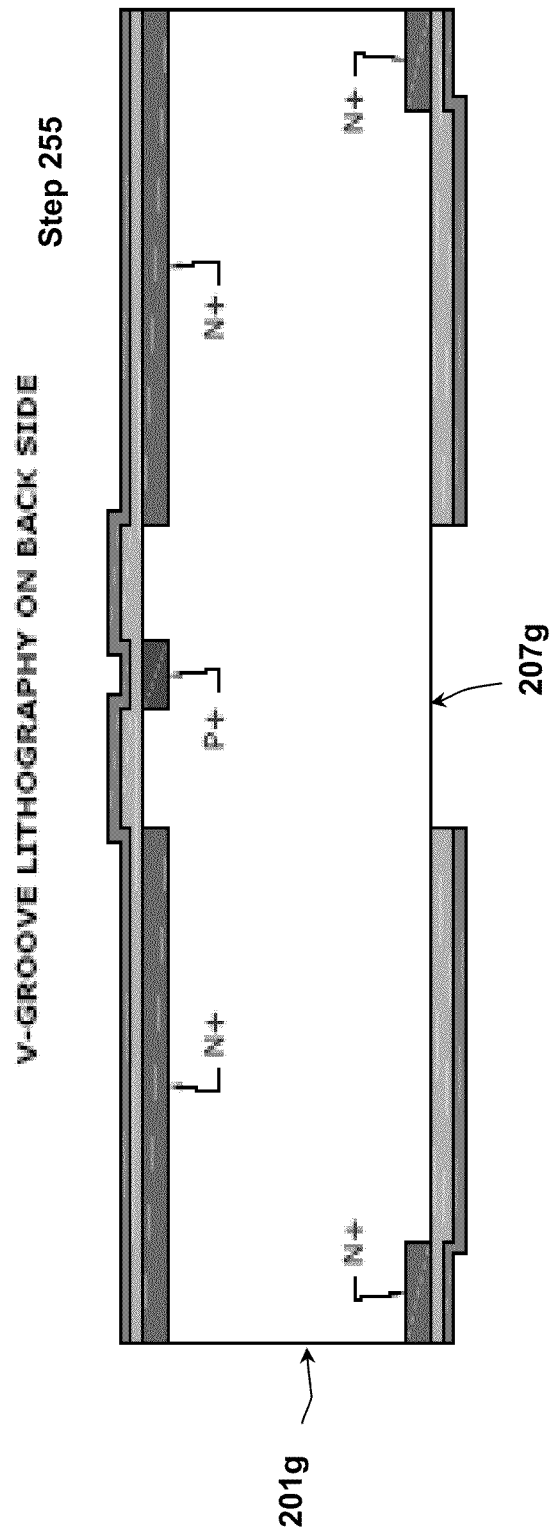
FIGS. 2a-2n illustrate one embodiment of the manufacturing steps of the high density, front-side contact, back-side illuminated, (FSC-BSL) photodiode array of the present invention.

Referring now to FIG. 2g, the back side of device wafer 201g is subjected to V-groove lithography in step 255 at region 207g Akin to conventional photolithographic process, V-groove photolithography comprises a plurality of routine tasks including, but not restricted to, substrate preparation, photoresist application, soft baking, mask alignment, exposure, developing, hard baking, etching, etc. respectively and various other chemical treatments (thinning agents, edge-bead removal etc.) in repeated steps on wafer 201g. It should be noted that in step 255, only the back side of the device wafer 201g is subjected to V-groove photolithography process.

V-groove masking is employed to protect portions of the device wafer 201g. The V-groove masking process is similar to that delineated with respect to the n+ and p+ masking processes, except for the fact that V-groove masking involves design and implementation of a customized V-groove mask, in accord with the principles of the present invention and will not be detailed herein. The V-groove photographic mask employed herein facilitates protection of certain regions confined to the back side of wafer 201g during V-groove etching and subsequent stripping process discussed later. In one embodiment, the V-groove mask comprises a plurality of V-groove windows with appropriate geometrical and dimensional specifications in accord with the present invention. For instance, V-groove mask employed in compliance with the present invention comprises a single V-groove window. In one embodiment, the pattern of the V-groove mask defines at least one region 207g devoid of the insulation and the oxide layer deposited in steps 250 and 220, respectively.

Figure 2H:
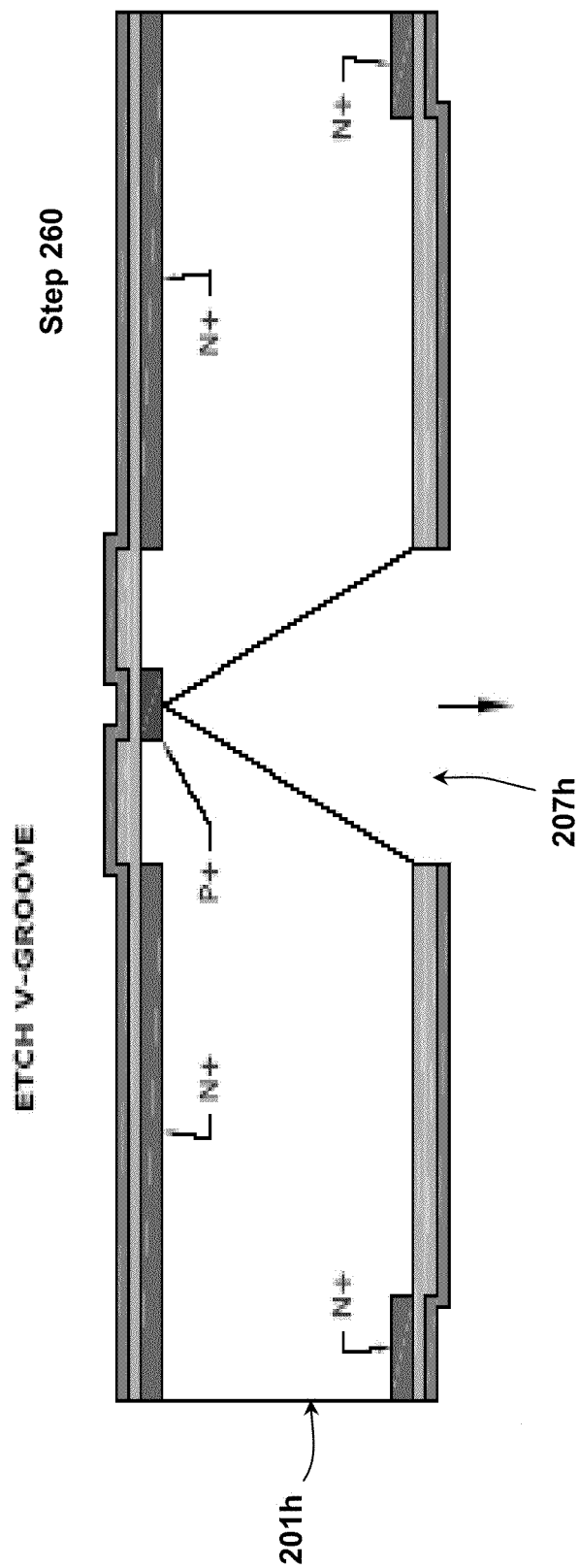

Now referring to FIG. 2h, region 207h is subject to a V-groove etching process in step 260. In one embodiment, region 207h, confined to back side of wafer 201h, may be selectively etched via a suitable V-groove etching technique utilizing the V-groove mask of the present invention to form a single V-groove therein. In one embodiment, orientation selective wet etching techniques are employed, including, but not limited to, isotropic and anisotropic etching. Via a wet etch technique, mono-crystalline wafers etch faster in certain crystallographic directions than in others, thereby allowing for certain layers or portions of the wafer to act as a "stop" for the etch process. This involves both selection of an appropriate wafer orientation and a suitable etchant. It must be noted here that the etch rate of silicon is orientation dependent.

In one embodiment, V-groove etching can be performed with a liquid anisotropic etchant, such as KOH; thus step 260 is implemented herein as a batch process resulting in much higher production throughput and lower cost. It should be noted here that if the etchant is KOH, the <1-0-0>-planes of the wafer are relatively slowly etched. It must also be noted that the more slowly etched crystal planes form the side and end walls of the V-groove. For example, if IPA is added to KOH, <1-1-0>-planes etch slower than <1-0-0>-planes, resulting in V-grooves with a 45° angle to the surface. In one embodiment, reactive ion etching (RIE) may be used to form concave grooves on the backside of device wafer 201h. The grooves formed via this technique, however, are "U"-shaped. The sidewalls of such grooves are more vertical, wherein the wall is angled at less than 10 degrees.

In one embodiment, the V-shaped groove, at region 207h, etched parallel to the <1-1-0> direction has planar facets, which bind the V-shaped groove, lying in the <1-1-1> plane. Further, it must be noted here that any mask opening in a <1-0-0>-wafer will turn into a square etch pit with four inclined <1-1-1>-walls or planes if etched long enough in which the <1-1-1>-planar facets are inclined at an angle of 54.7° with respect to the <1-0-0> plane. In one embodiment, a if square mask opening is rotated 45° relative to the wafer 201h flat, the <1-0-0>-planes, vertical to the surface, are revealed. In one embodiment, anisotropic etching is preferably performed, which virtually stops at the <1-1-1>-planes, thus a square mask opening etched long enough produces a pyramidal pit. If the square is stretched to a long thin line, the etch pit will turn into a long groove with a V-shaped cross-section. This so-called V-groove can be used for several purposes; such as but not limited to, positioning of optical fibers, providing channels for distribution of fluids, etc. Dimensions of the groove are controlled by the corresponding V-groove mask windows, the accuracy of their alignment with the crystal axes, the erosion rate of the edges of the mask, and the relative etch rates of the crystal planes. Typically, the finished widths of V-grooves can be controlled to within 0.5 to 1 μm. The scope and spirit of the invention is no way limited, and other 3-D microstructures of varying shapes and dimensions including, but not limited to, grooves, pyramidal pits, pyramidal cavities etc. may be etched into the wafer in accordance to the properties of the present invention. Such various other microstructures will be readily apparent to one of ordinary skill in the art having the benefit of this disclosure. The above specifications are not limiting with respect to the 3-D microstructures and their accompanying dimensions as they can be changed to suit any design, fabrication, and functional requirements.

Figure 2I:
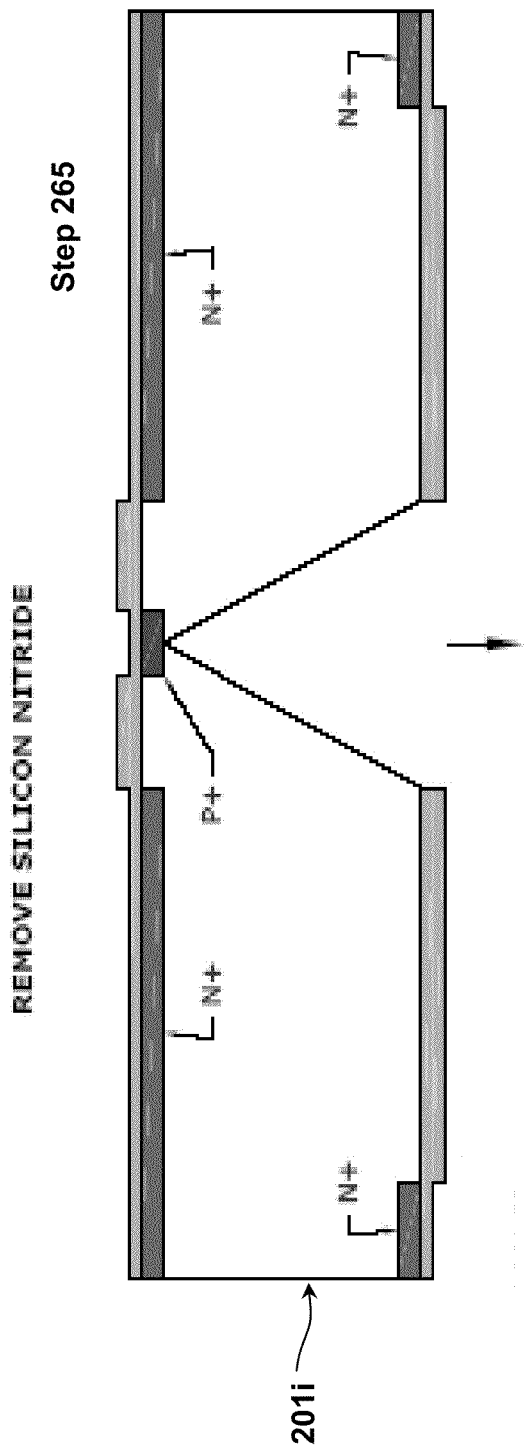

In step 265, as shown in FIG. 2i, the silicon nitride passivation 251 layer formed on both the front side and back side of the wafer in step 250, and shown in FIG. 2f, is removed. Stripping of the passivation layer is routine action of engineering and is readily known to those of ordinary skill in the art and will not be discussed in further detail herein.

Figure 2J:
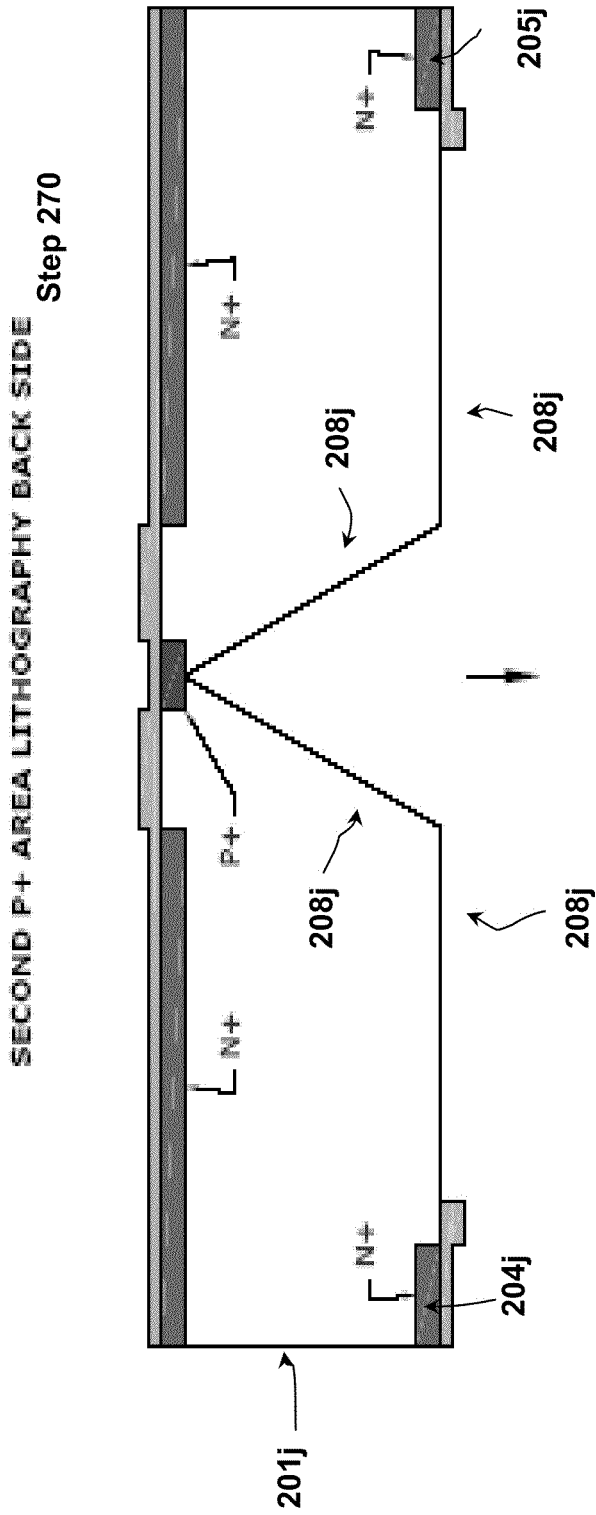

As shown in FIG. 2j, the back side of device wafer 201j is subjected to a second p+ lithography process in step 270. In one embodiment, a substantial portion 208j of the wafer 201j comprising the V-groove and confined to the backside, excluding the n+ diffused regions 204j and 205j, is defined using p+ photolithography. It must be noted here that the second p+ lithography process is analogous to the first p+ area lithography process except that in second p+ lithography backside of wafer 201j is processed. Thus, details of the p+ lithography processed will not be discussed herein as they have already been described above.

Figure 2K:
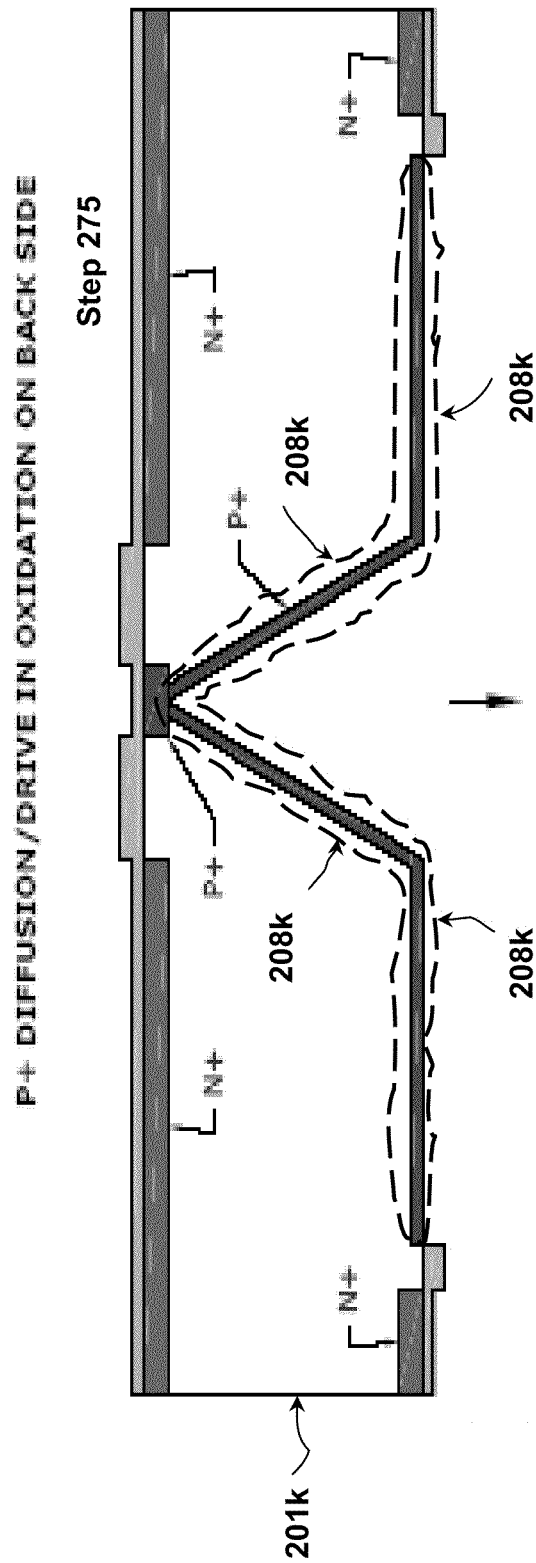
Figure 2I:
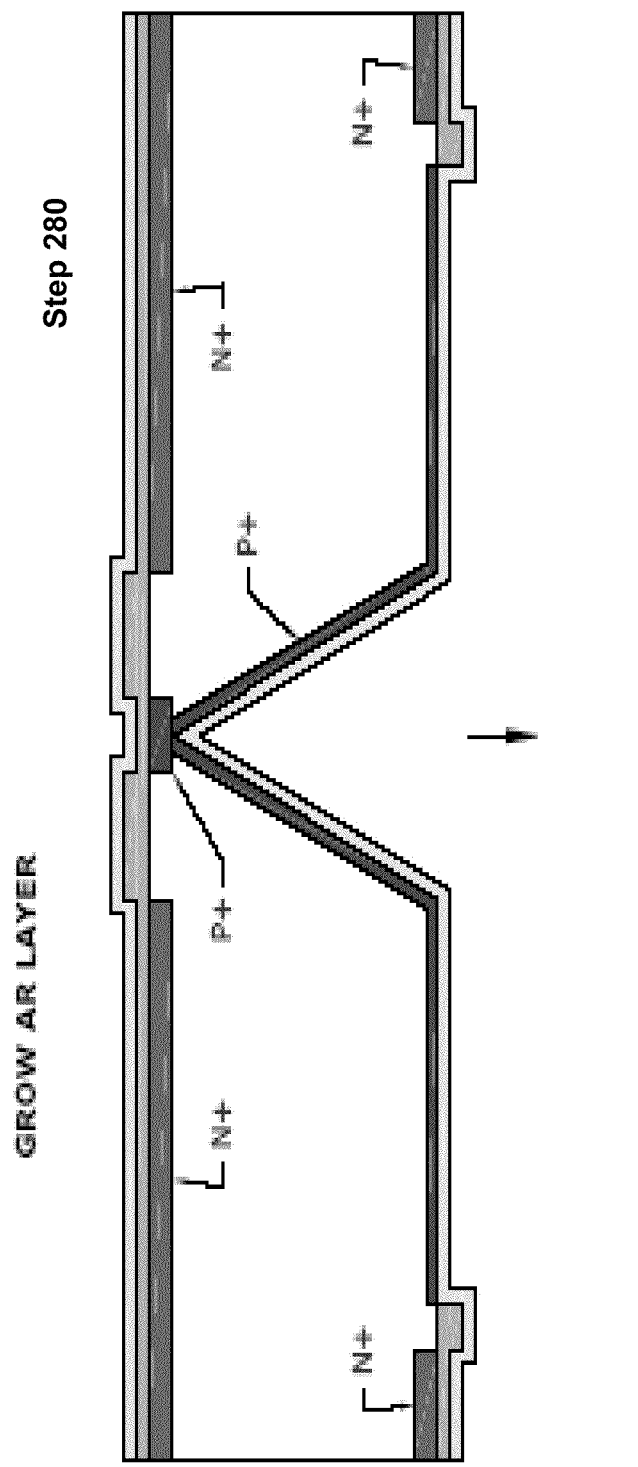

In step 275, as shown in FIG. 2k, portion 208k is subject to p+ masking and diffusion. The p+ masking and diffusion process is similar to that delineated with respect to the n+ masking process described above and will not be repeated in detail herein. The p+ masking process of step 275 further comprises deposition and drive-in oxidation, allowing for predefined and/or predetermined thermal budget in accord with the principles of the present invention. In one embodiment, the p+ dopant is boron.

Now referring to FIG. 2l, an anti-reflective (AR) layer is grown on the front-side and back-side of the device via thermal oxidation in step 280. Various anti-reflective coating designs, such as 1 layer, 2 layer, 3 layer, and 4+ layers may be employed. By way of example, and by no means limiting, the 1 layer anti-reflective coating design adopted herein utilizes thin film materials, such as oxides, sulfides, fluorides, nitrides, selenides, metals, among others. In one embodiment of the present invention, the anti-reflective layer comprises $SiO_2$ (i.e. silicon dioxide antireflective). Preferably, the $SiO_2$ has a thickness of 900 Å.

As shown in FIG. 2*m*, in step 285, a contact etch mask is used to etch a contact window onto the front side of the wafer. The contact window is formed on the front side of the treated substrate wafer by using standard semiconductor technology photolithography techniques. The contact window oxide can then be removed by either standard wet or standard dry etching techniques as are well known to those of ordinary skill in the art.

More specifically, and not limited to such example, in one embodiment of the photodiode array of the present invention, a contact window mask is first applied, followed by etching with a contact window oxide on selected regions of the front side of device wafer 201*m*. Contact lithography, well-known to those of ordinary skill in the art, involves printing an image or pattern via illumination of a photomask in direct contact with a substrate coated with an imaging photoresist layer.

In one embodiment, a plurality of contact windows 211*m* are formed on the front side of the device wafer 201*m*, using the contact window mask. Typically, a contact window is an aperture defined in a surface passivation layer through which device metallization develops contact with circuit elements. In one embodiment, the contact window mask is a dark field mask, which is used to remove the silicon oxide layer in both n-type and p-type regions requiring contacts. While contact masks have conventionally been fairly large (on the order of 100 mm or higher), it is possible that alignment tolerances may necessitate smaller mask sizes to allow stepping between exposures. As in nano-imprint lithography, the mask needs to have roughly the same feature size as the desire image.

Using the contact mask, at least one or a plurality of contact windows 211*m* are opened through the protective oxide layer deposited on the surface of device wafer 201*m*. In one embodiment, contact window etching is achieved via a chemical etching process, wherein the wafer is immersed in a buffered oxide etch (BOE), a HF acid-based solution for intervals sufficient enough to remove the layers exposed by the contact window mask.

Referring now to FIG. 2*n*, the device wafer 201*n* is subjected to a metal deposition process 290 to etch metal on the front side of the wafer for creating electrical connections to n+ and p+ diffused regions. In the metal deposition process, also called metallization, metal layers are deposited on the wafer to create conductive pathways. The most common metals include aluminum, nickel, chromium, gold, germanium, copper, silver, titanium, tungsten, platinum, and tantalum. Selected metal alloys may also be used. Metallization is often accomplished with a vacuum deposition technique. The most common deposition processes include filament evaporation, electron-beam evaporation, flash evaporation, induced evaporation, and sputtering, followed by metal masking and etching. Metal etching can be performed in a variety of methods, including, but not limited to abrasive etching, dry etching, electroetching, laser etching, photo etching, reactive ion etching, sputter etching, and vapor phase etching. In one embodiment, metal deposition lithography comprises initial performance of metal deposition followed by etching metal on front side of wafer 201*n* facilitating development of connection to regions 212*n*.

As mentioned above, the present invention is also directed towards a front-side illuminated, back-side contact (FSL-BSC) photodiode array having improved characteristics, including high production throughput, low-cost manufacturing via implementation of batch processing techniques; uniform and high photocurrent density due to the presence of a large continuous homogeneous, heavily doped layer; and front to back intrachip connections via the homogenous, heavily doped layers on the front and back sides of the substrate. In one embodiment, the FSL-BSC photodiode array of the present invention comprises at least a plurality of front side illuminated photodiodes, optionally organized in the form of an array, with both anode and cathode contacts confined to the backside. In one embodiment, the FSL-BSC photodiode array further comprises a continuous p+ diffusion region that facilitates the generation of a uniform photocurrent.

Figure 3:
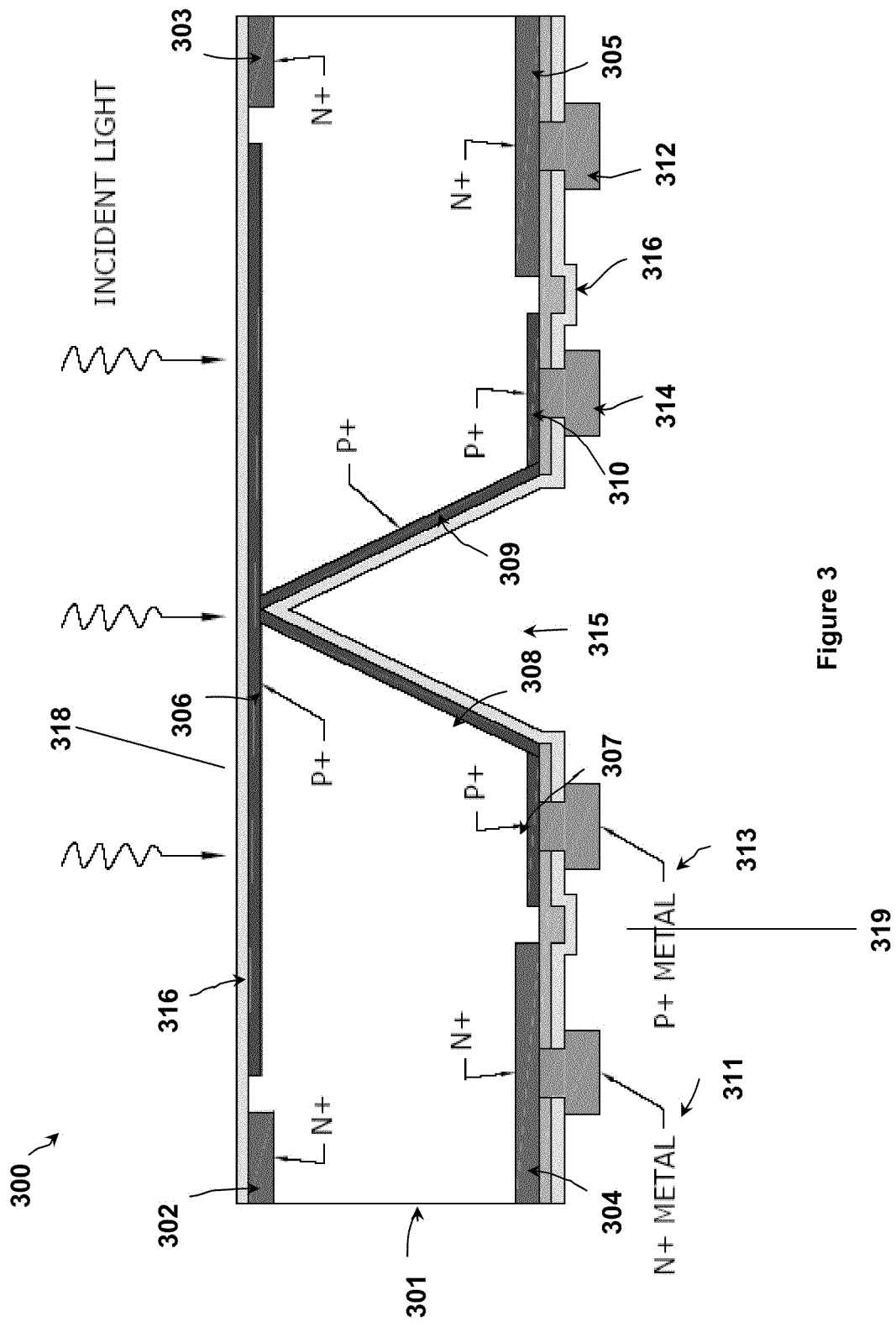
FIG. 3 is a detailed cross-sectional illustration of one embodiment of a high density front-side illuminated, back-side contact (FSL-BSC) photodiode array of the present invention.

Referring now to FIG. 3, a detailed cross-sectional illustration of one embodiment of a high density front-side illuminated, back-side contact (FSL-BSC) photodiode array of the present invention is shown. In one embodiment, the FSL-BSC photodiode array 300 of the present invention comprises device wafer 301 and a plurality of heterogeneously heavily doped regions. In one embodiment, the FSL-BSC photodiode array 300 further comprises n+ heavily doped regions 302, 303, 304, and 305 and p+ heavily doped regions 306, 307, 308, 309, and 310. The FSL-BSC photodiode array of the present invention further comprises heavily doped n+ metal contacts 311 and 312, and heavily doped p+ metal contacts 313 and 314, positioned on the backside 319 of substrate wafer 301. FSL-BSC 300 further comprises at least one V-groove 315 on the backside 319 of wafer 301. In addition, FSL-BSC 300 comprises anti-reflective (AR) layer 316 on both the frontside 318 and backside 319 of device wafer 301.

The manufacturing process of the FSL-BSC photodiode array of the present invention will now be described in greater detail. In one embodiment, the FSL-BSC photodiode array of the present invention is designed and fabricated at low-cost with high production throughput and high-density of integration capable of generating uniform as well as high-photocurrent density. The FSL-BSC photodiode array comprises at least a plurality of heterogeneous, heavily doped regions that 1) form front to back connections and 2) facilitate generation of uniform photocurrent. More particularly, the photodiode array of the present invention is capable of generating uniform photocurrent due to the presence of continuous p+ diffusion regions.

Figure 3A:
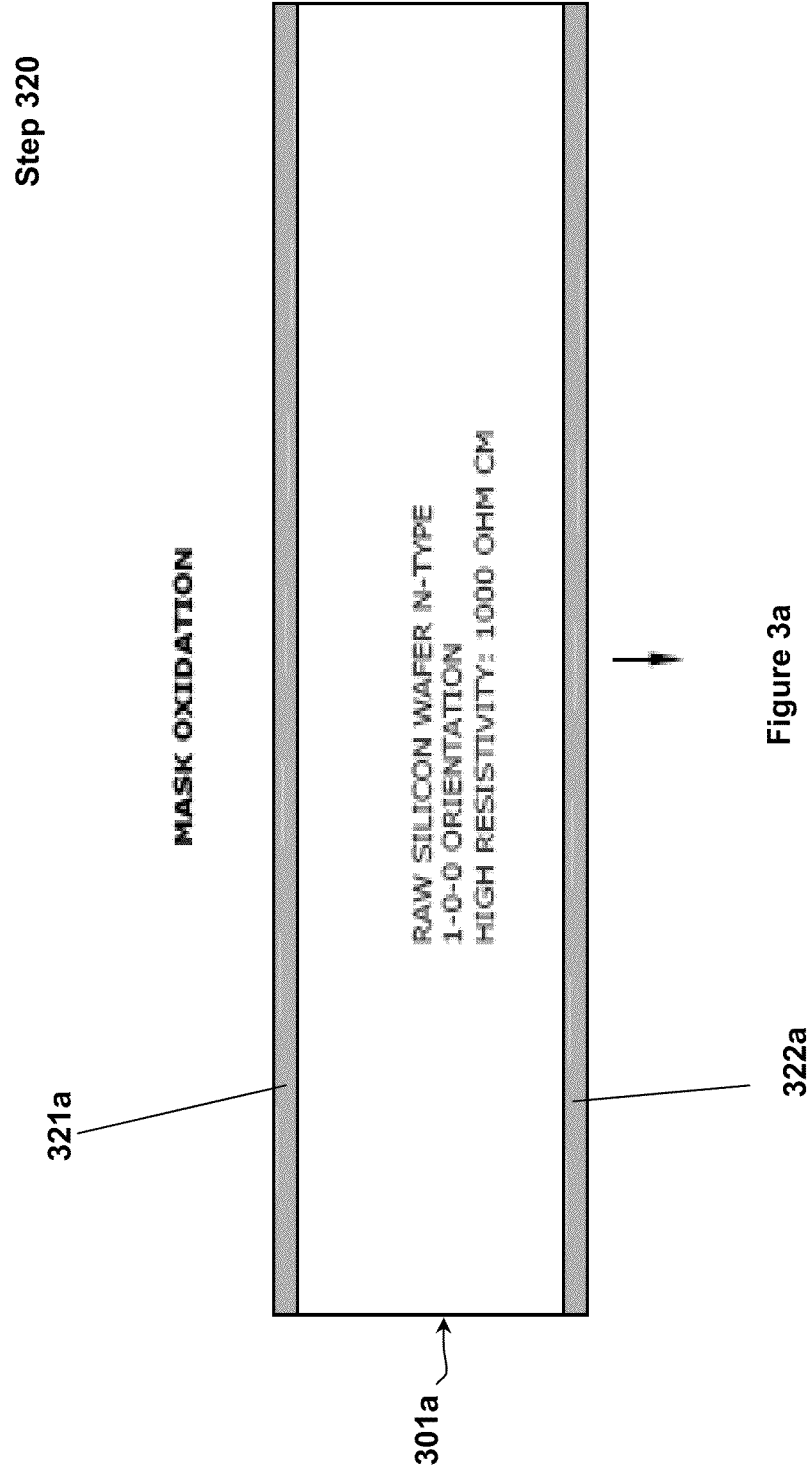
FIGS. 3a-3n illustrate one embodiment of the manufacturing steps of the high density, front-side illuminated, back-side contact (FSL-BSC) photodiode array of the present invention.
Figure 3B:
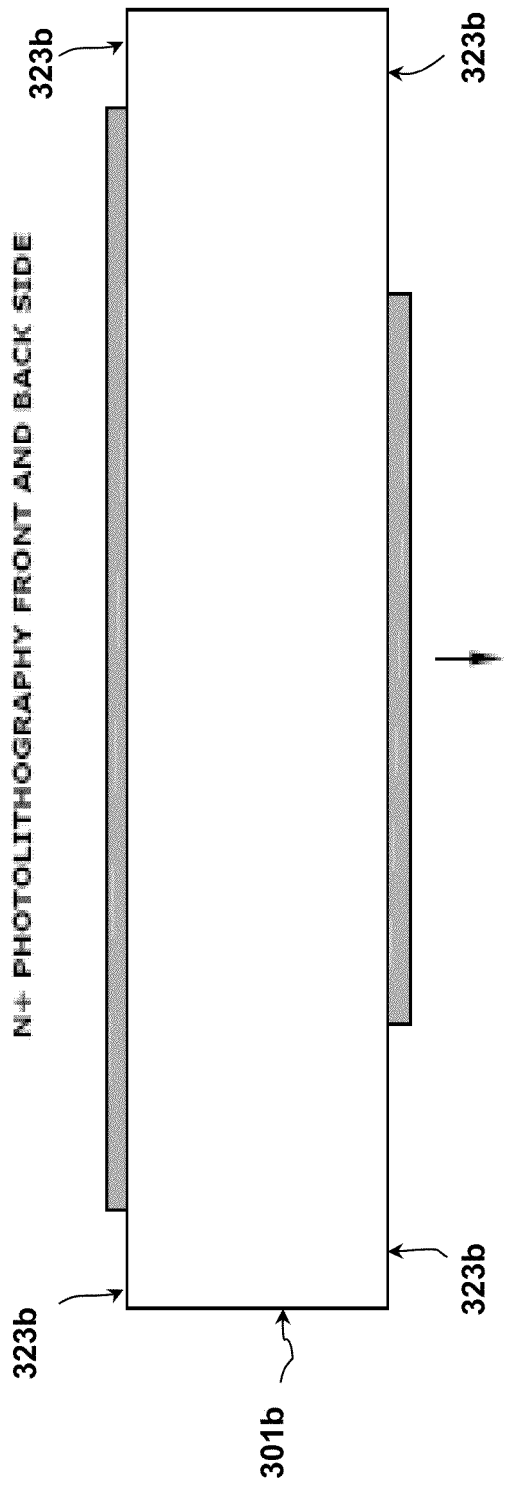
Figure 3C:
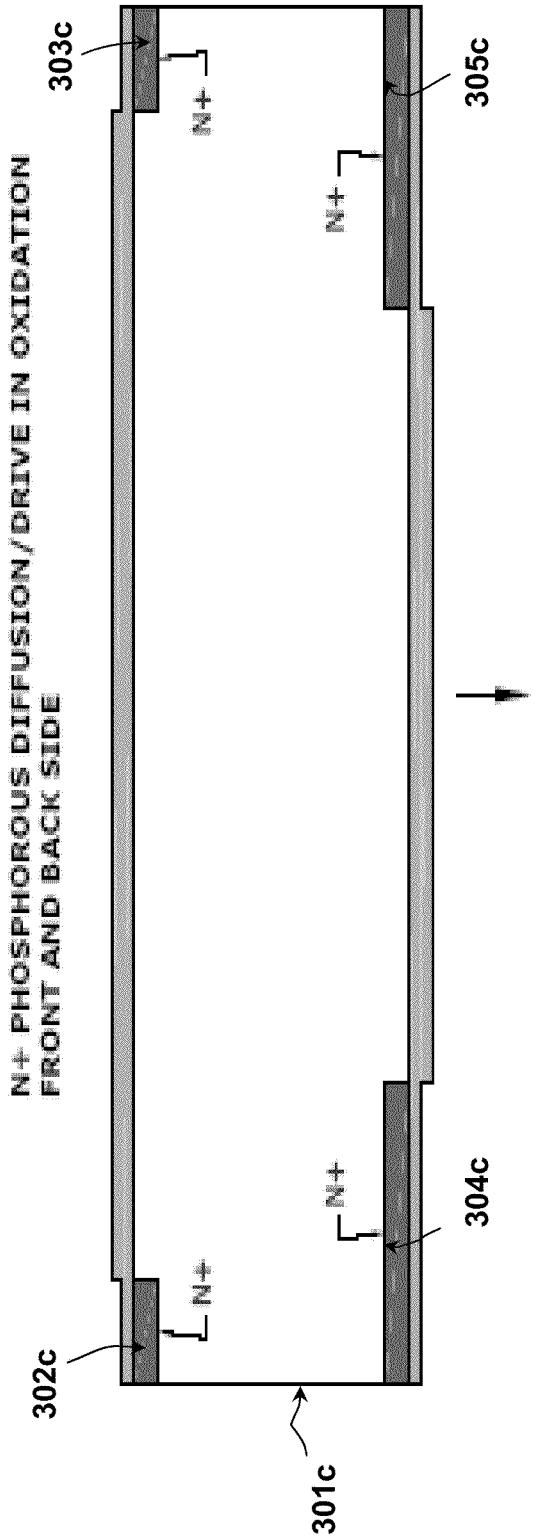
Figure 3D:
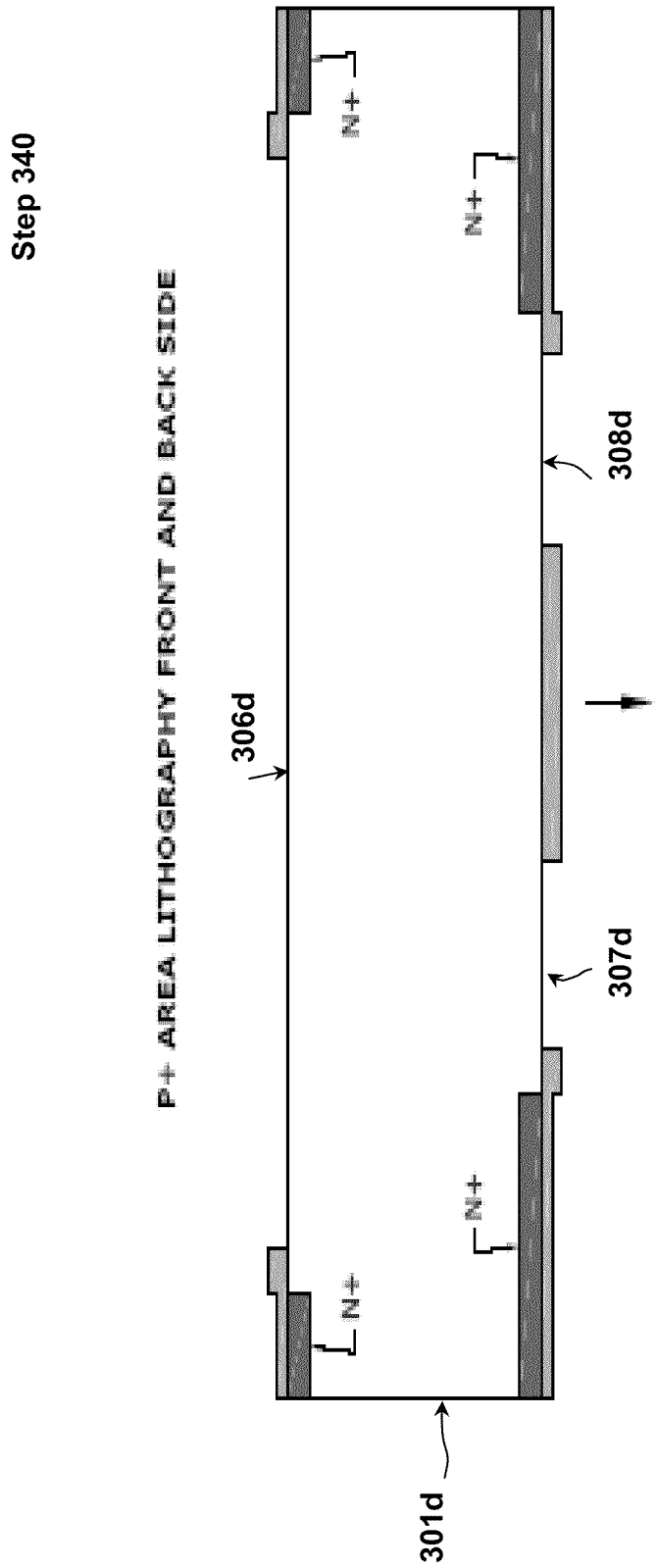
Figure 3E:
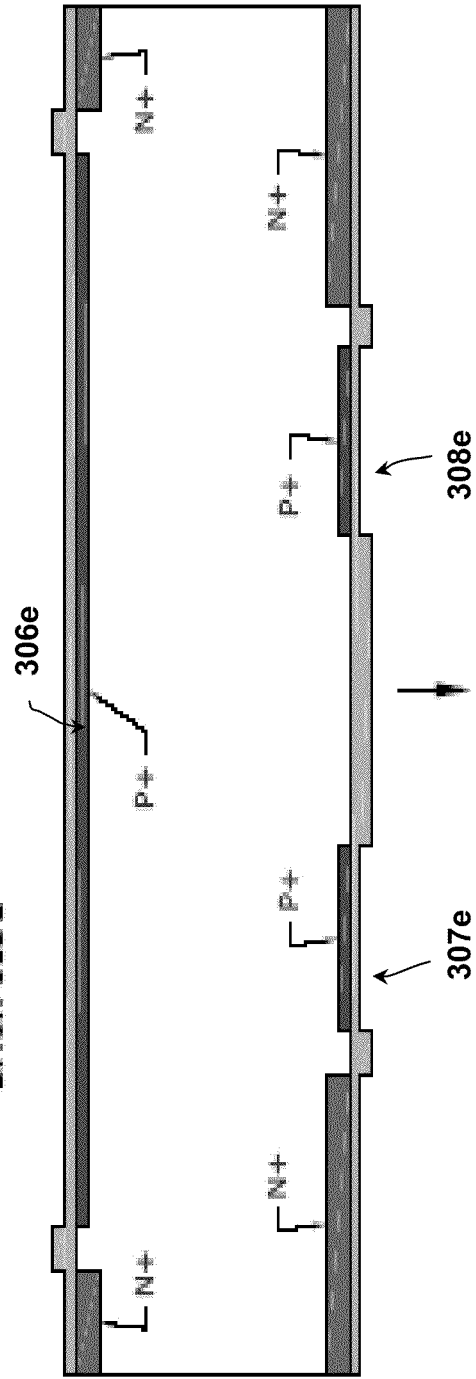
Figure 3G:
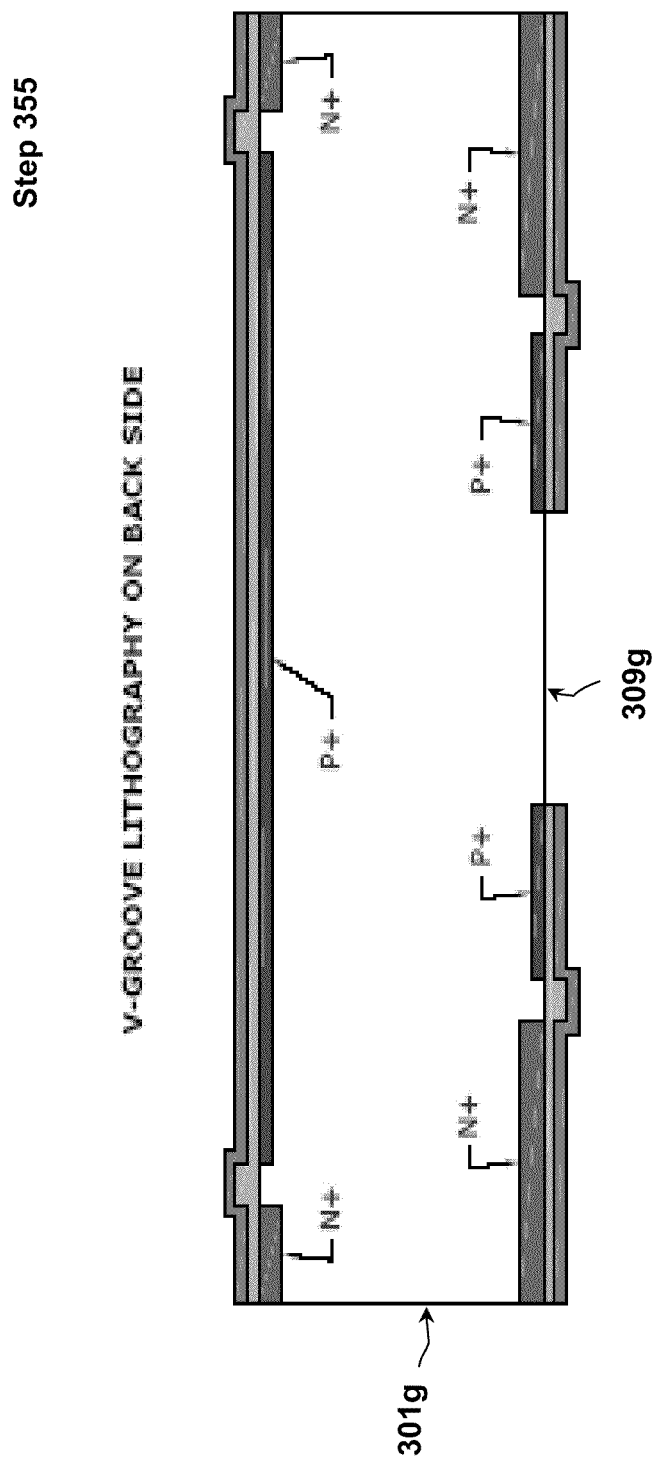
Figure 3H:
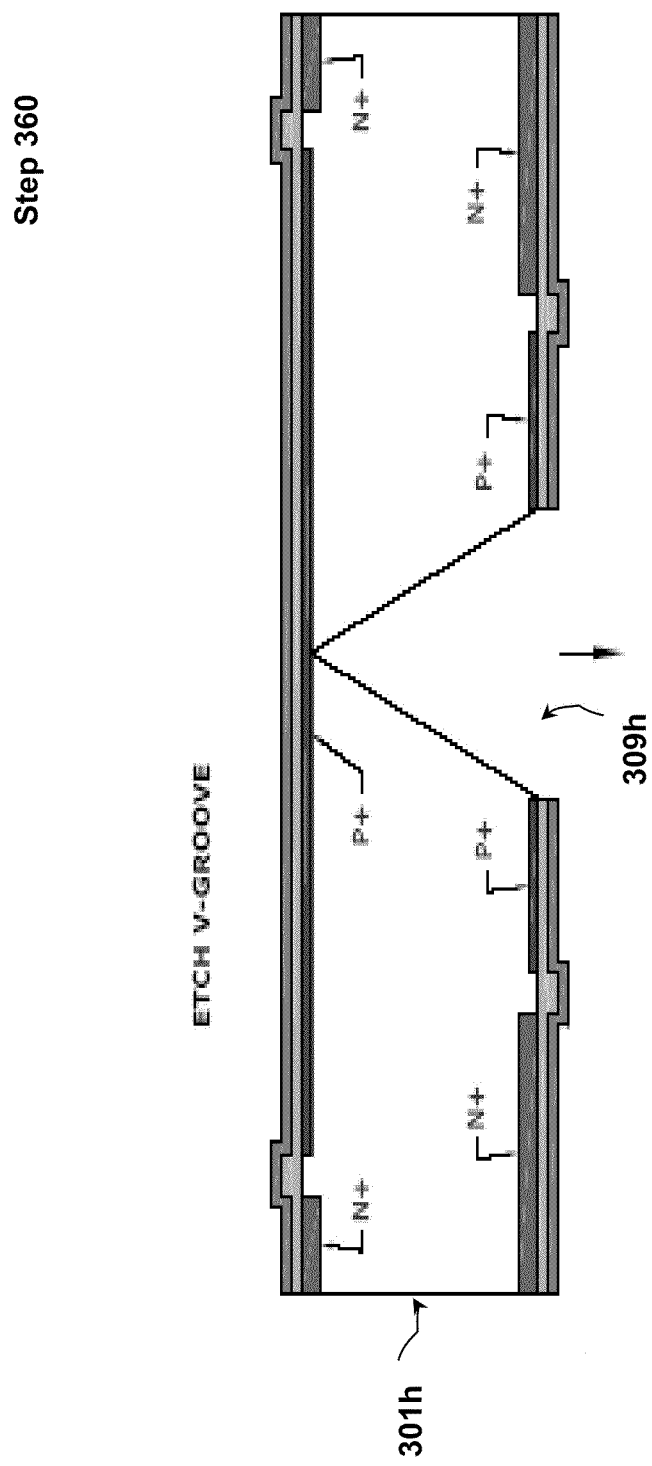
Figure 3I:
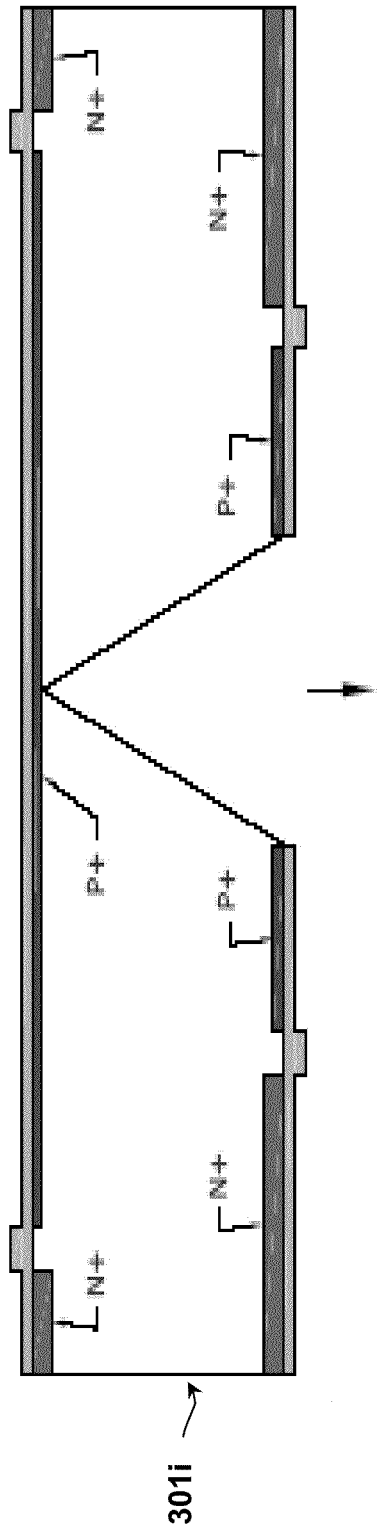
Figure 3J:
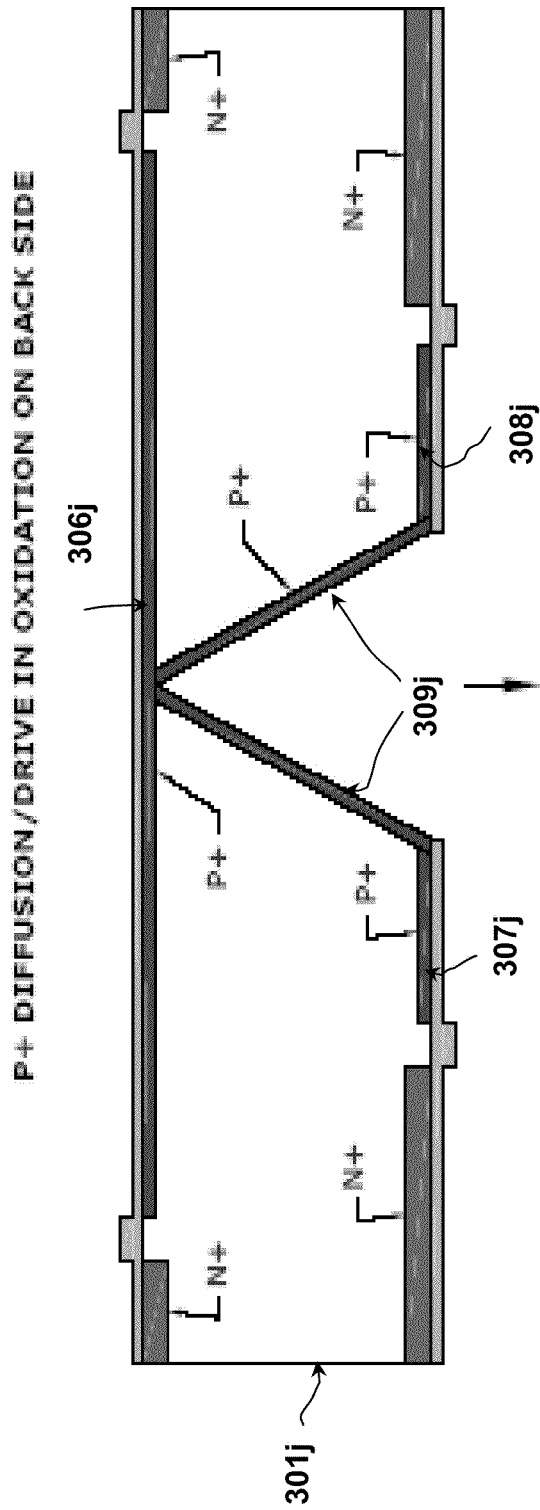
Figure 3I:
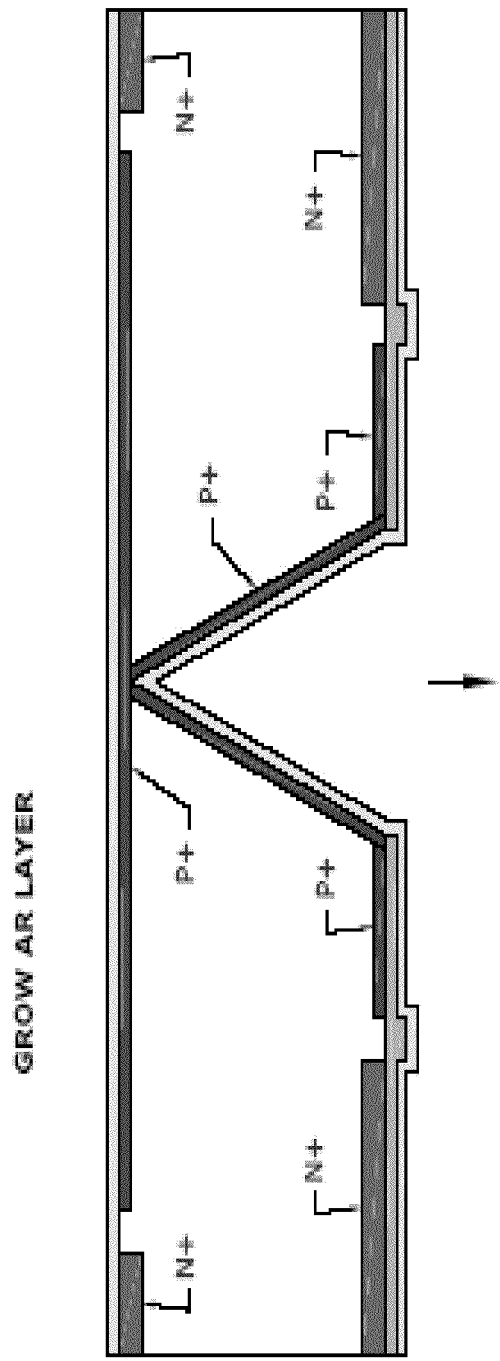
Figure 3N:
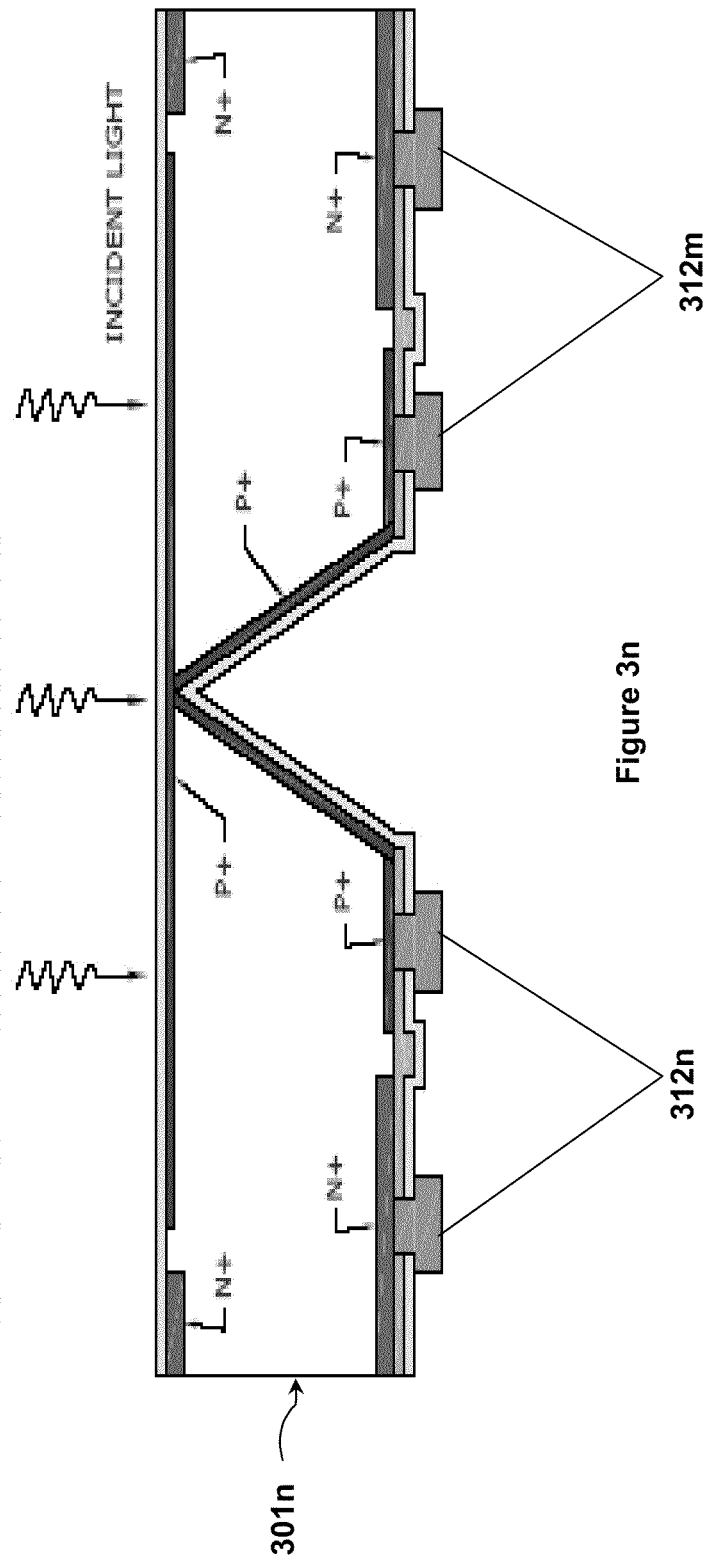

Now referring to FIGS. 3*a*-3*n*, the manufacturing steps of one embodiment of the high density, front-side illuminated, back-side contact (FSL-BSC) photodiode array of the present invention are described. The manufacturing steps delineated herein provide one manufacturing example of the photodiode array of the present invention. Modifications or alterations to the manufacturing steps, their corresponding details, and any order presented may be readily apparent to those of ordinary skill in the art. Thus, the present invention contemplates many possibilities for manufacturing the photodiode array of the present invention and is not limited to the examples provided herein.

Referring now to FIG. 3*a*, the starting material of the photodiode array of the present invention is device or substrate wafer 301*a*. Device wafer 301*a* is preferably Si, of n-type conductivity, a crystal orientation of <1-0-0> and a resistivity as high as 1000 Ohm cm ($\Omega$cm). In addition, device wafer 301 is polished on both sides to allow for greater conformity to parameters, surface flatness, and thickness specifications. It should be understood by those of ordinary skill in the art, however, that the above specifications are not binding and that the type of material and wafer size, resistivity, and conductivity can be easily changed to suit the design, fabrication, and functional requirements of the present invention.

In step 320, device wafer 301a is subjected to standard mask oxidation process that grows a mask oxide layer 321a and 322a on the front-side and on the back-side of the device wafer, respectively. In one embodiment, the oxidation mask is made of $SiO_2$ or $Si_3N_4$ and thermal oxidation is employed to achieve mask oxidation. Standard mask oxidation is well known to those of ordinary skill in the art and will not be described in further detail herein.

As shown in FIG. 3b, after the standard mask oxidation is complete in step 320, the device wafer is subjected to n+ photolithography on both the front-side 318 and back-side 319 of device wafer 301b in step 325. Photolithography includes employing a photoresist layer to etch a specific pattern on the surface of the wafer. Generally, the photoresist layer is a photosensitive polymeric material for photolithography and photoengraving that can form a patterned coating on a surface. After selecting a suitable material and creating a suitable photoresist pattern, a thin photoresist layer is applied to both the front side and back side of device wafer 301b. In one embodiment, photoresist layer is applied via a spin coating technique. Spin coating is well-known to those of ordinary skill in the art and will not be described in detail herein. The photoresist layer is then appropriately treated to reveal n+ diffusion regions.

In an optional step, the device wafer is subjected to n+ masking. N+ masking is employed to protect portions of device wafer 301b. Generally, photographic masks are high precision plates containing microscopic images of preferred pattern or electronic circuits. They are typically fabricated from flat pieces of quartz or glass with a layer of chrome on one side. The mask geometry is etched in the chrome layer. In one embodiment, the n+ mask comprises a plurality of diffusion windows with appropriate geometrical and dimensional specifications. The photoresist coated device wafer 301b is aligned with the n+ mask. An intense light, such as UV light, is projected through the mask, exposing the photoresist layer in the pattern of the n+ mask. The n+ mask allows selective irradiation of the photoresist on the device wafer. Regions that are exposed to radiation are hardened while those that are reserved for diffusion remain shielded by the n+ mask and easily removed. The exposed and remaining photoresist is then subjected to a suitable chemical or plasma etching process to reveal the pattern transfer from the mask to the photoresist layer. An etching process is then employed to remove the silicon dioxide layer. In one embodiment, the pattern of the photoresist layer and/or n+ mask defines at least one region devoid of the oxide layer deposited in step 320 and ready for n+ diffusion. In one embodiment, and as shown in FIG. 3b, the pattern of the photoresist layer and/or n+ mask defines four regions 323b, which are devoid of the oxide layer and ready for n+ diffusion.

Now referring to FIG. 3c, in step 330, device wafer 301c is subjected to n+ diffusion followed by drive-in oxidation after the n+ masking and etching step at regions 302c, 303c, 304, and 305c. Generally, diffusion facilitates propagation of a diffusing material through a host material. In a semiconductor wafer fabrication process, diffusion is employed to convert exposed portions of an n-type silicon wafer into a p-type silicon, or vice versa. In step 330, an appropriate amount of dopant atoms is deposited onto the substrate wafer and fills the gaps left by the removed photoresist layer. Then, the wafer is subjected to a drive-in oxidation process that is used to redistribute the dopant atoms and deposit them deeper into the wafer. In addition, exposed silicon surfaces are oxidized. As described above, in one embodiment, the simultaneous front and backside diffusion involves using a suitable dopant of n-type conductivity. In one embodiment, simultaneous front-side and back-side diffusion on device wafer 301c may be achieved by using a liquid dopant source and rapid thermal processing (RTP), also as described above and not repeated herein.

The resultant n+ diffusion regions are then subjected to, in step 335, high temperature drive-in oxidation, thus driving the dopant deeper into wafer 301c, as described in detail above. In one embodiment, the low thermal budget diffusion process used to manufacture the FSL-BSC photodiode of the present invention comprises two steps: a first deposition/diffusion step, and a second drive-in oxidation step. The two-step example provided above is by way of example only and no way limiting to the present invention. It should be understood by those of ordinary skill in the art that any number of steps may be performed, keeping in mind overall cost efficiency and thermal budget of the device.

Referring now to FIG. 3d, in step 340, both the front side and back side of device wafer 301d undergoes a first p+ area photolithography process, creating regions 306d, 307d, and 308d. As with any conventional photolithographic process, p+ photolithography comprises at least the following tasks, but is not limited to such tasks: substrate preparation; photoresist application; soft baking; mask alignment; exposure; development; hard baking; and etching. In addition, various other chemical treatments may be performed. In one embodiment, the pattern of the photoresist layer and/or p+ mask defines regions 306d, 307d, and 308d.

As shown in FIG. 3e, regions 306e, 307e, and 308e are subject to p+ masking and diffusion in step 345. The p+ masking and diffusion process is similar to that delineated with respect to the n+ masking process described above and will not be repeated in detail herein. The p+ masking process of step 345 further comprises deposition and drive-in oxidation, allowing for predefined and/or predetermined thermal budget in accord with the principles of the present invention. In one embodiment, the p+ dopant is boron.

In step 350, shown in FIG. 3f, an insulation layer 351 of a suitable material is deposited on the front-side and the back-side of the device via suitable oxidation or nitridation techniques. By way of example, and by no means limiting, the insulation layer grown herein may utilize thin film materials, such as oxides, sulfides, fluorides, nitrides, selenides, and metals, among others. In one embodiment of the present invention, the insulation layer comprises silicon nitride $Si_3N_4$. In one embodiment, the $Si_3N_4$ layer is uniformly grown over both the front-side and the back-side of the wafer via employment of suitable chemical vapor deposition techniques. In one embodiment, the $Si_3N_4$ layer is grown such that it is transparent to UV light that facilitates UV treatment of the wafer during future photolithographic processes, if any. Generally, $Si_3N_4$ commonly used in silicon integrated circuit manufacturing is a dielectric material serving several purposes, such as a passivation layer or as a mask (barrier or insulation) against oxidation of the AR layer. Preferably, the $Si_3N_4$ has energy gap ~5 eV and density ~3.0 g/cm$^3$.

Referring now to FIG. 3g, the back side of device wafer 301g is subjected to V-groove lithography in step 355 at region 309g Akin to conventional photolithographic process, V-groove photolithography comprises a plurality of routine tasks including, but not restricted to, substrate preparation, photoresist application, soft baking, mask alignment, exposure, developing, hard baking, etching, etc. respectively and various other chemical treatments (thinning agents, edge-bead removal etc.) in repeated steps on wafer 301g. It should be noted that in step 355, only the back side of the device wafer 301g is subjected to V-groove photolithography process.

V-groove masking is employed to protect portions of the device wafer 301g. The V-groove masking process is similar to that delineated with respect to the n+ and p+ masking processes, except for the fact that V-groove masking involves design and implementation of a customized V-groove mask, in accord with the principles of the present invention and will not be detailed herein. The V-groove photographic mask employed herein facilitates protection of certain regions confined to the back side of wafer 301g during V-groove etching and subsequent stripping process discussed later. In one embodiment, the V-groove mask comprises a plurality of V-groove windows with appropriate geometrical and dimensional specifications in accord with the present invention. For instance, V-groove mask employed in compliance with the present invention comprises a single V-groove window. In one embodiment, the pattern of the V-groove mask defines at least one region 309g devoid of the insulation and the oxide layer deposited in steps 350 and 320, respectively.

Now referring to FIG. 3h, region 309h is subject to a V-groove etching process in step 360. In one embodiment, region 309h, confined to back side of wafer 301h, may be selectively etched via a suitable V-groove etching technique utilizing the V-groove mask of the present invention to form a single V-groove therein. In one embodiment, orientation selective wet etching techniques are employed, including, but not limited to, isotropic and anisotropic etching. Via a wet etch technique, mono-crystalline wafers etch faster in certain crystallographic directions than in others, thereby allowing for certain layers or portions of the wafer to act as a "stop" for the etch process. This involves both selection of an appropriate wafer orientation and a suitable etchant. It must be noted here that the etch rate of silicon is orientation dependent. A preferred V-groove etching technique has already been described with respect to FIG. 2h above and will not be repeated herein.

In one embodiment, the V-shaped groove, at region 309h, etched parallel to the <1-1-0> direction has planar facets, which bind the V-shaped groove, lying in the <1-1-1> plane. Further, it must be noted here that any mask opening in a <1-0-0>-wafer will turn into a square etch pit with four inclined <1-1-1>-walls or planes if etched long enough in which the <1-1-1>-planar facets are inclined at an angle of 54.7° with respect to the <1-0-0>-plane. In one embodiment, a if square mask opening is rotated 45° relative to the wafer 201h flat, the <1-0-0>-planes, vertical to the surface, are revealed. In one embodiment, anisotropic etching is preferably performed, which virtually stops at the <1-1-1>-planes, thus a square mask opening etched long enough produces a pyramidal pit. If the square is stretched to a long thin line, the etch pit will turn into a long groove with a V-shaped cross-section. This so-called V-groove can be used for several purposes; such as but not limited to, positioning of optical fibers, providing channels for distribution of fluids, etc. Dimensions of the groove are controlled by the corresponding V-groove mask windows, the accuracy of their alignment with the crystal axes, the erosion rate of the edges of the mask, and the relative etch rates of the crystal planes. Typically, the finished widths of V-grooves can be controlled to within 0.5 to 1 μm. The scope and spirit of the invention is no way limited, and other 3-D microstructures of varying shapes and dimensions including, but not limited to, grooves, pyramidal pits, pyramidal cavities etc. may be etched into the wafer in accordance to the properties of the present invention. Such various other microstructures will be readily apparent to one of ordinary skill in the art having the benefit of this disclosure. The above specifications are not limiting with respect to the 3-D microstructures and their accompanying dimensions as they can be changed to suit any design, fabrication, and functional requirements.

In step 365, as shown in FIG. 3i, the silicon nitride passivation 351 layer formed on both the front side and back side of the wafer in step 350, and shown in FIG. 3f, is removed. Stripping of the passivation layer is routine action of engineering and is readily known to those of ordinary skill in the art and will not be discussed in further detail herein.

As shown in FIG. 3j, the back side of device wafer 301j is subjected to a second p+ lithography process in step 370. In one embodiment, regions 306j, 307j, 308j and 309j of the wafer 301j, are defined using p+ photolithography. It must be noted here that the second p+ lithography process is analogous to the first p+ area lithography process except that in this second p+ lithography process, the backside of wafer 301j is processed. Thus, details of the p+ lithography processed will not be discussed herein as they have already been described above.

In one embodiment or the p+ diffusion process, the dopant is boron. In one embodiment, the V-groove etching and subsequent doping, either via diffusion or ion implant, facilitates the development of a connection between shallow p+ regions 307j, 308j, confined to back side of wafer 301j, and the shallow p+ region 306j confined to front side of wafer 301j. The shallow p+ region 306j created in step 345, is continuous and represents the p+ active area of each element of the photodiode array. Shallow p+ active area layer is susceptible to short wavelength light, falling in the range of 380 to 600 nm, emitted from scintillator crystals. Electron hole pairs, photo-generated in the depletion layer, are immediately collected in the depletion region of this shallow junction, resulting in high speed, high quantum efficiency of the frontside-illuminated, backside contact photodiode array, even when operated in zero-bias photovoltage mode.

In step 375, as shown in FIG. 3k, the oxide layer grown in step 320 is removed from the front side of wafer 301k. Removal of the oxide layer is well-known to those or ordinary skill in the art and will not be discussed in further detail herein. In one embodiment, the front-side of wafer 301k is completely devoid of the oxide layer owing to oxide stripping.

Now referring to FIG. 3l, an anti-reflective (AR) layer is grown on the front-side and back-side of the device via thermal oxidation in step 380. Various anti-reflective coating designs, such as 1 layer, 2 layer, 3 layer, and 4+ layers may be employed. By way of example, and by no means limiting, the 1 layer anti-reflective coating design adopted herein utilizes thin film materials, such as oxides, sulfides, fluorides, nitrides, selenides, metals, among others. In one embodiment of the present invention, the anti-reflective layer comprises $SiO_2$ (i.e. silicon dioxide antireflective). Preferably, the $SiO_2$ has a thickness of 900 Å.

As shown in FIG. 3m, in step 385, a contact etch mask is used to etch contact windows onto the back side of the wafer. The contact window is formed on the back side of the treated substrate wafer by using standard semiconductor technology photolithography techniques. The contact window oxide can then be removed by either standard wet or standard dry etching techniques as are well known to those of ordinary skill in the art.

More specifically, and not limited to such example, in one embodiment of the photodiode array of the present invention, a contact window mask is first applied, followed by etching with a contact window oxide on selected regions of the back side of device wafer 301m. Contact lithography, well-known to those of ordinary skill in the art, involves printing an image or pattern via illumination of a photomask in direct contact with a substrate coated with an imaging photoresist layer.

In one embodiment, a plurality of contact windows 311m are formed on the back side of the device wafer 301m, using the contact window mask. Typically, a contact window is an aperture defined in a surface passivation layer through which device metallization develops contact with circuit elements. In one embodiment, the contact window mask is a dark field mask, which is used to remove the silicon oxide layer in both n-type and p-type regions requiring contacts. While contact masks have conventionally been fairly large (on the order of 100 mm or higher), it is possible that alignment tolerances may necessitate smaller mask sizes to allow stepping between exposures. As in nano-imprint lithography, the mask needs to have roughly the same feature size as the desire image.

Using the contact mask, at least one or a plurality of contact windows 311m are opened through the protective oxide layer deposited on the surface of device wafer 301m. In one embodiment, contact window etching is achieved via a chemical etching process, wherein the wafer is immersed in a buffered oxide etch (BOE), a HF acid-based solution for intervals sufficient enough to remove the layers exposed by the contact window mask.

Referring now to FIG. 3n, the device wafer 301n is subjected to a metal deposition process 390 to etch metal on the back side of the wafer for creating electrical connections to n+ and p+ diffused regions. In the metal deposition process, also called metallization, metal layers are deposited on the wafer to create conductive pathways. The most common metals include aluminum, nickel, chromium, gold, germanium, copper, silver, titanium, tungsten, platinum, and tantalum. Selected metal alloys may also be used. Metallization is often accomplished with a vacuum deposition technique. The most common deposition processes include filament evaporation, electron-beam evaporation, flash evaporation, induced evaporation, and sputtering, followed by metal masking and etching. Metal etching can be performed in a variety of methods, including, but not limited to abrasive etching, dry etching, electroetching, laser etching, photo etching, reactive ion etching, sputter etching, and vapor phase etching. In one embodiment, metal deposition lithography comprises initial performance of metal deposition followed by etching metal on front side of wafer 301n facilitating development of connection to regions 312n.

The above examples are merely illustrative of the many applications of the system of present invention. Although only a few embodiments of the present invention have been described herein, it should be understood that the present invention might be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

What is claimed is:

1. A photodiode, having an incident light receiving side and a side opposing the incident light receiving side, comprising:
    a substrate having a V-shaped groove positioned between the incident light receiving side and the side opposing the incident light receiving side, wherein the V-shaped groove is defined by a first inclined side and a second inclined side, wherein said first inclined side and said second inclined side intersect at a point;
    a first doped region positioned at said point, wherein said first doped region is in electrical communication with a metal contact;
    a second doped region positioned along the first inclined side and in physical communication with said first doped region; and
    a third doped region positioned along the second inclined side and in physical communication with said first doped region, wherein each of said first, second and third doped region are of the same conductivity type and wherein the first, second, and third doped region form a continuous electrical connection between said incident light receiving side and said side opposing the incident light receiving side.

2. The photodiode of claim 1 wherein the conductivity type is p-type.

3. The photodiode of claim 1 wherein the second doped region is positioned along the first inclined side and further extends along a portion of the side opposing the incident light receiving side.

4. The photodiode of claim 1 wherein the third doped region is positioned along the second inclined side and further extends along a portion of the side opposing the incident light receiving side.

5. The photodiode of claim 1 wherein said V-shaped groove divides the photodiode into a first region and a second region.

6. The photodiode of claim 5, wherein the first region comprises a fourth doped region of a second conductivity type proximate to said incident light receiving side.

7. The photodiode of claim 6 wherein said second conductivity type is a n-type.

8. The photodiode of claim 5, wherein the second region comprises a fourth doped region of a second conductivity type proximate to said incident light receiving side.

9. The photodiode of claim 7 wherein said second conductivity type is a n-type.

10. A photodiode, having an incident light receiving side and a side opposing the incident light receiving side, comprising:
    a substrate having a V shaped groove positioned between the incident light receiving side and the side opposing the incident light receiving side, wherein the V-shaped groove is defined by a first inclined side and a second inclined side, wherein said first inclined side and said second inclined side meet at a point;
    a first doped region positioned at said point;
    a second doped region positioned along the first inclined side and in physical communication with said first doped region; and
    a third doped region positioned along the second inclined side and in physical communication with said first doped region, wherein each of said first, second and third doped region are of the same conductivity type and wherein the first, second, and third doped region form a continuous electrical connection between said incident light receiving side and said side opposing the incident light receiving side.

11. The photodiode of claim 10 further comprising at least one passivation layer on the incident light receiving side of the substrate.

12. The photodiode of claim 10 further comprising at least one passivation layer on the side opposing the incident light receiving side of the substrate.

13. The photodiode of claim 10 further comprising at least one anti-reflective layer on the incident light receiving side.

14. The photodiode of claim 10 further comprising at least one anti-reflective layer on the side opposing the incident light receiving side of the substrate.

15. The photodiode of claim 10 further comprising a plurality of contact electrodes in electrical communication with at least one of said doped regions.

16. The photodiode of claim 10 wherein the impurity of each of said first, second, and third doped regions is p-type.

* * * * *